(12) United States Patent
Boujamaa et al.

(10) Patent No.: US 9,202,543 B2
(45) Date of Patent: Dec. 1, 2015

(54) SYSTEM AND METHODS USING A MULTIPLEXED REFERENCE FOR SENSE AMPLIFIERS

(71) Applicant: Intel Mobile Communications GmbH, Neubiberg (DE)

(72) Inventors: El Mehdi Boujamaa, Grasse (FR); Cyrille Dray, Portland, OR (US)

(73) Assignees: Intel Deutschland GmbH, Neubiberg (DE); Infineon Technologies AG, Neubiberg (DE)

( * ) Notice: Subject to any disclaimer, the term of this patent is extended or adjusted under 35 U.S.C. 154(b) by 352 days.

(21) Appl. No.: 13/689,869

(22) Filed: Nov. 30, 2012

(65) Prior Publication Data

US 2014/0153313 A1   Jun. 5, 2014

(51) Int. Cl.
| | |
|---|---|
| G11C 11/16 | (2006.01) |
| G11C 7/14 | (2006.01) |
| G11C 7/06 | (2006.01) |
| G11C 13/00 | (2006.01) |
| G11C 27/02 | (2006.01) |

(52) U.S. Cl.
CPC .............. *G11C 11/16* (2013.01); *G11C 7/062* (2013.01); *G11C 7/14* (2013.01); *G11C 11/1673* (2013.01); *G11C 13/0002* (2013.01); *G11C 13/004* (2013.01); *G11C 27/02* (2013.01); *G11C 2013/0054* (2013.01)

(58) Field of Classification Search
CPC .. G11C 11/16; G11C 13/004; G11C 13/0002; G11C 7/062; G11C 11/1673; G11C 7/14; G11C 27/02; G11C 2013/0054

USPC ............. 365/148, 158, 163, 171, 173, 185.2, 365/185.21, 202, 206, 207, 210.1, 210.11, 365/210.14

See application file for complete search history.

(56) References Cited

U.S. PATENT DOCUMENTS

| | | | |
|---|---|---|---|
| 4,907,201 A | 3/1990 | Minami et al. | |
| 5,049,758 A | 9/1991 | Mead et al. | |
| 6,194,956 B1* | 2/2001 | Barnes ........................ | 327/538 |
| 7,443,234 B2 | 10/2008 | Iriguchi | |
| 8,570,095 B1 | 10/2013 | Ryat | |
| 2003/0103395 A1* | 6/2003 | Ooishi ........................ | 365/201 |
| 2004/0062074 A1* | 4/2004 | Ooishi ........................ | 365/158 |
| 2006/0152262 A1 | 7/2006 | Park | |
| 2007/0085608 A1 | 4/2007 | Iriguchi et al. | |
| 2007/0200622 A1* | 8/2007 | Filoramo et al. ................. | 330/10 |
| 2012/0294090 A1 | 11/2012 | Chang et al. | |
| 2013/0265820 A1 | 10/2013 | Chih et al. | |
| 2014/0063923 A1* | 3/2014 | Jefremow et al. ............. | 365/158 |
| 2014/0153313 A1 | 6/2014 | Boujamaa et al. | |

OTHER PUBLICATIONS

Notice of Allowance Dated Oct. 3, 2014 U.S. Appl. No. 13/605,693.
U.S. Appl. No. 13/605,693 Filed on Sep. 6, 2012.

(Continued)

*Primary Examiner* — J. H. Hur
(74) *Attorney, Agent, or Firm* — Eschweiler & Associates, LLC

(57) ABSTRACT

A sense amplifier system includes a first path, a second path, a memory cell, a first reference cell, a second reference cell, and a switch component. The switch component is configured to switch connections between the first and second reference cells and the first and second paths according to a sampling phase and an amplification phase.

22 Claims, 22 Drawing Sheets

(56) References Cited

OTHER PUBLICATIONS

Jisu Kim, et al.; "A Novel Sensing Circuit for Deep Submicron Spin Transfer Torque MRAM (STT-MRAM)"; IEEE Transactions on Very Large Scale Integration (VLSI) Systems, 2010, p. 1-5.

Christian C. Enz, et al.; "Circuit Techniques for Reducing the Effects of Op-Amp Imperfections: Autozeroing, Correlated Double Sampling, and Chopper Stabilization", Proceedings of the IEEE, vol. 84, No. 11, Nov. 1996, p. 1584-1614.

T. M. Maffitt, et al.; "Design Considerations for MRAM", IBM J. RES. & DEV., vol. 50, No. 1, Jan. 2006, p. 25-39.

M. Hosomi, et al.; "A Novel Nonvolatile Memory with Spin Torque Transfer Magnetization Switching: Spin-RAM", 2005 IEEE, p. 1-4.

El Mehdi Boujamaa, "Low Offset, High Gain Sense Amplifier for Resistive Memories Featuring a Time Multiplexed Reference", Intel Mobile Communications—Sophia Antipolis—France, Jun. 19, 2012, p. 1-12.

T. Kawahara; "Non-Volatile Memory and Normally-Off Computing", ASP-DAC 2011, Jan. 26, 2011, Yokohama, Japan, p. 1-53.

\* cited by examiner

US 9,202,543 B2

SYSTEM AND METHODS USING A MULTIPLEXED REFERENCE FOR SENSE AMPLIFIERS

BACKGROUND

Magnetic and resistive types of memory devices are devices that utilize a layer or cell of material that has a changeable and settable value. The cell is set to a logical value by applying a current, voltage, heat and/or a magnetic field. In one example, a resistive memory device includes a dielectric layer configured to change resistance values according to an applied voltage. In another example, a magnetic field is induced to switch a magnetic tunneling junction (MTJ) state, which is referred to as field induced switching (FIS).

One feature of magnetic or resistive memories is that they are generally non-volatile, which means that their contents remain without power or refresh cycles as is required for dynamic memory devices. One issue that these types of memories have faced is the need to obtain higher densities.

DETAILED DESCRIPTION

Figure 1:
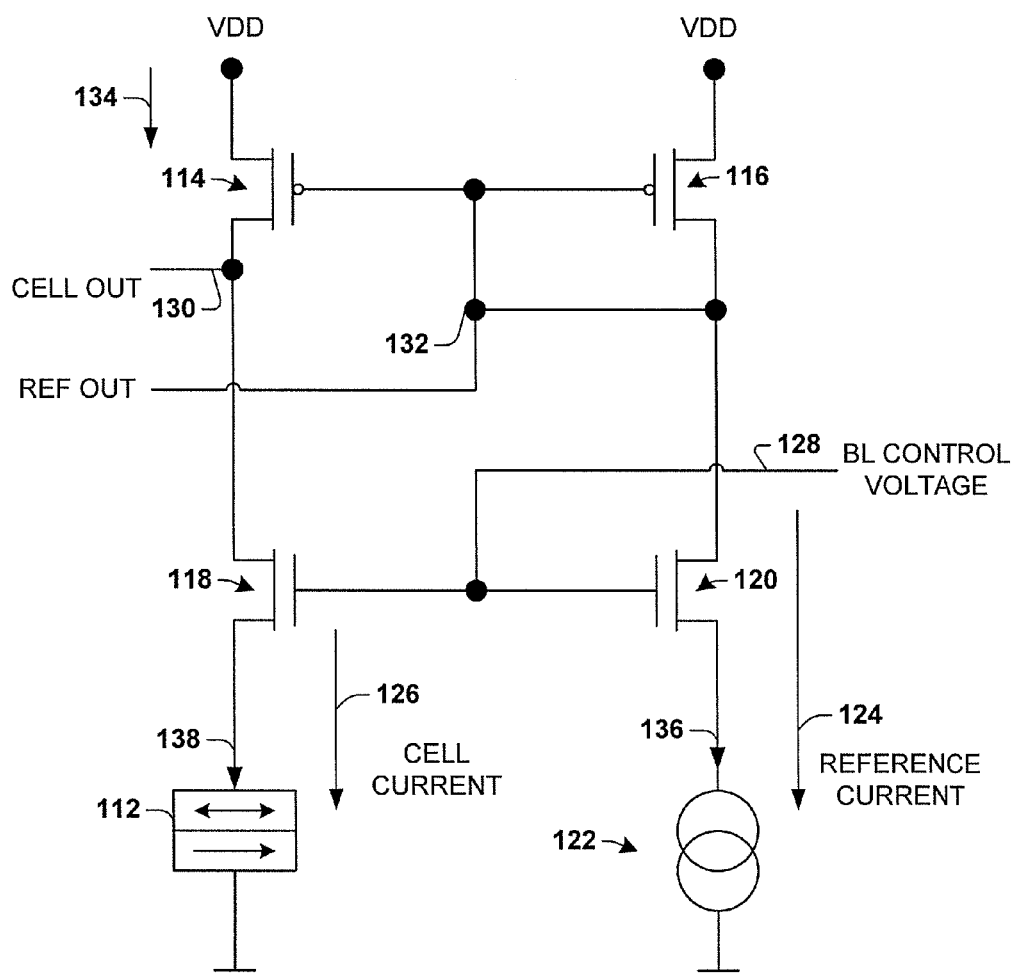
FIG. 1 is a schematic diagram of a conventional system for sensing a magnetic memory cell.

The present invention will now be described with reference to the attached drawing figures, wherein like reference numerals are used to refer to like elements throughout, and wherein the illustrated structures and devices are not necessarily drawn to scale.

Resistive memory and magnetoresistive random access memory (MRAM) are non-volatile random access memories in which data is stored by magnetic and/or resistive storage elements. Resistive and magnetoresistive memories include spin torque transfer (STT) and field induced switching (FIS) type memories. A typical MRAM cell comprises two ferromagnetic plates separated by a thin insulating layer. One of the two plates is a permanent magnet ("fixed layer") set to a particular polarity while the field of the second plate ("free layer") can be configured to match that of an external field to store data. This configuration is known as a spin valve and is the simplest structure for an MRAM bit. Such magnetic memory cells may be combined to form a memory device.

Sensing or reading a magnetic memory cell can be accomplished by measuring the electrical resistance of the cell. A particular cell is typically selected by powering an associated transistor that switches current from a bitline through the cell to ground. The electrical resistance of the cell changes due to the spin orientation of the electrons in the two plates of the STT MRAM cell. By measuring the resulting current, the resistance inside any particular cell can be determined. In general, the cell is considered to be a "1" if the two plates have the same polarity and a "0" if the two plates are of opposite polarity and have a higher resistance.

FIG. 1 is a schematic diagram of a conventional system 100 for sensing a magnetic memory cell 112 such as a Spin Torque Transfer Magnetoresistive Random Access Memory (STT MRAM) cell or a field induced switching memory (FIS MRAM). The system 100 includes a plurality of transistors, 114, 116, 118 and 120, a reference current source 122 for providing a reference current 124, a cell current 126 from the memory cell 112, a bitline (BL) control voltage 128, a cell output node 130, a reference output node 132 and a mirrored reference current 134. The transistors 114 and 116 are PMOS transistors and the transistors 118 and 120 are NMOS transistors.

In operation, the two pairs of transistors (114, 116, 118, and 120) of the sensing system 100 adjust and sense the cell current 126 and the reference current 124 and convert the current difference into a voltage difference between the output nodes 130 and 132. The first pair of transistors 114 and 116 acts as a current mirror while transistors 118 and 120 act as clamp devices for bitline voltage regulation, which can be adjusted by BL control voltage 128. After the BL control voltage 128 is set, transistors 118 and 120 charge the reference bitline 136 and the cell bitline 138 to a fixed potential which is typically about one threshold voltage of NMOS transistor below BL control voltage 128. The PMOS transistor 116, which is part of the current mirror, senses the reference current 124 which flows through the NMOS transistor 120. The reference current source 122 provides the reference current 124. The reference current 124 is generally set between the current which corresponds to a high current STT MRAM cell state and the current corresponding to a low current STT MRAM cell state. This reference current 124 is mirrored simultaneously by the PMOS current mirror 114, 116 to the cell out node 130. The cell current 126 flows through the NMOS transistor 118 to the cell out node 130. If the cell current 126 is higher than the reference current 124, then the cell out voltage 130 is driven to ground. If the cell current 126 is lower than the reference current 124, then the cell out voltage 130 goes up to VDD. The voltage at the reference out node 132 remains fixed at about one threshold voltage of the PMOS transistor 116 below VDD due to the diode connected PMOS 116. The voltage difference between the cell out node 130 and the reference out node 132 is compared and amplified by a subsequent differential latch circuit (not shown) to a full CMOS level.

There are several issues presented by the system 100. One issue is the accuracy of the mirrored reference current 134. Another is the difference between the bitline voltage 138 and the reference bitline voltage 136. To obtain the state or contents of the memory cell, the output voltages are probed. The output voltages are based on the cell state and transistor threshold value variations for transistors in the sense amplifier. The collective threshold variations can vary substantially in sense amplifiers due to fabrication variations and the like. The collective threshold variations are referred to as the offset. If the offset is measured suitably, the offset can be utilized to more accurately identify the state of the memory cell.

The mismatch of threshold voltages Vtp of the PMOS transistors 114, 116 in the current mirror leads to a mismatch of the mirrored reference current 134. The mismatch of the threshold voltages Vtn of the NMOS transistors 118, 120 results in different voltages across the selected cell 112 and the reference current source 122, which may also be a preconditioned STT-MRAM cell. This voltage difference or offset leads to a current difference between the reference current 124 and the cell current 126 for the same resistances for both paths since the current of an STT MRAM cell is directly proportional to a voltage across it.

Two approaches for reducing the offset include increasing the transistor size and incorporating a different sense amplifier architecture. Increasing transistor size is difficult because the relation of offset to size is a square root law, which requires a relatively large transistor size increase for only a moderate reduction in the offset. Larger sized transistors require more silicon space and lead to higher parasitic capacitances, which severely degrade timing performance.

Some other techniques compensate for transistor variations (offset) by measuring an offset in a sampling or sensing phase and compensating for the measured offset in a signal amplification phase. In the sensing phase, the offset is measured. In the signal amplification phase, an output voltage is measured and the offset is subtracted or removed from the output voltage to obtain a value that indicates a state of a memory cell. Two general approaches are referred to as a partial offset cancellation technique (POCT) and a full offset cancellation technique (FOCT).

POCT is a technique that at least partially measures and compensates for transistor voltage variations. In one example, POCT utilizes a capacitor between reference and data PMOS transistors. The portion of the offset from the PMOS transistors is canceled out by the capacitor. The offset is stored on the capacitor during offset sensing and is utilized to cancel out the PMOS offset during a signal amplification phase.

FOCT also uses a capacitor to sample a PMOS offset, but additionally samples a gate to source voltage of a data PMOS transistor needed to generate a reference current in the signal amplification phase. The FOCT uses only one temporarily shared current path for data current and a reference current ($I_{DATA}$ and $I_{REF}$) so that the same transistors are used during both offset sampling and signal amplification phases. The reference current is typically an average value that needs to be generated using a plurality of reference cells.

This disclosure includes a time multiplexed reference cell scheme in order to reduce the offset and enhance performance. The time multiplex scheme, described below, utilizes a simple sense amplifier architecture while obtaining better performance than the sense amplifier system 100 described in FIG. 1. Generation of an average reference current is not required because different reference cells and different reference currents are utilized and multiplexed for different phases of operation (i.e., sampling phase and signal amplification phase).

Figure 2A:
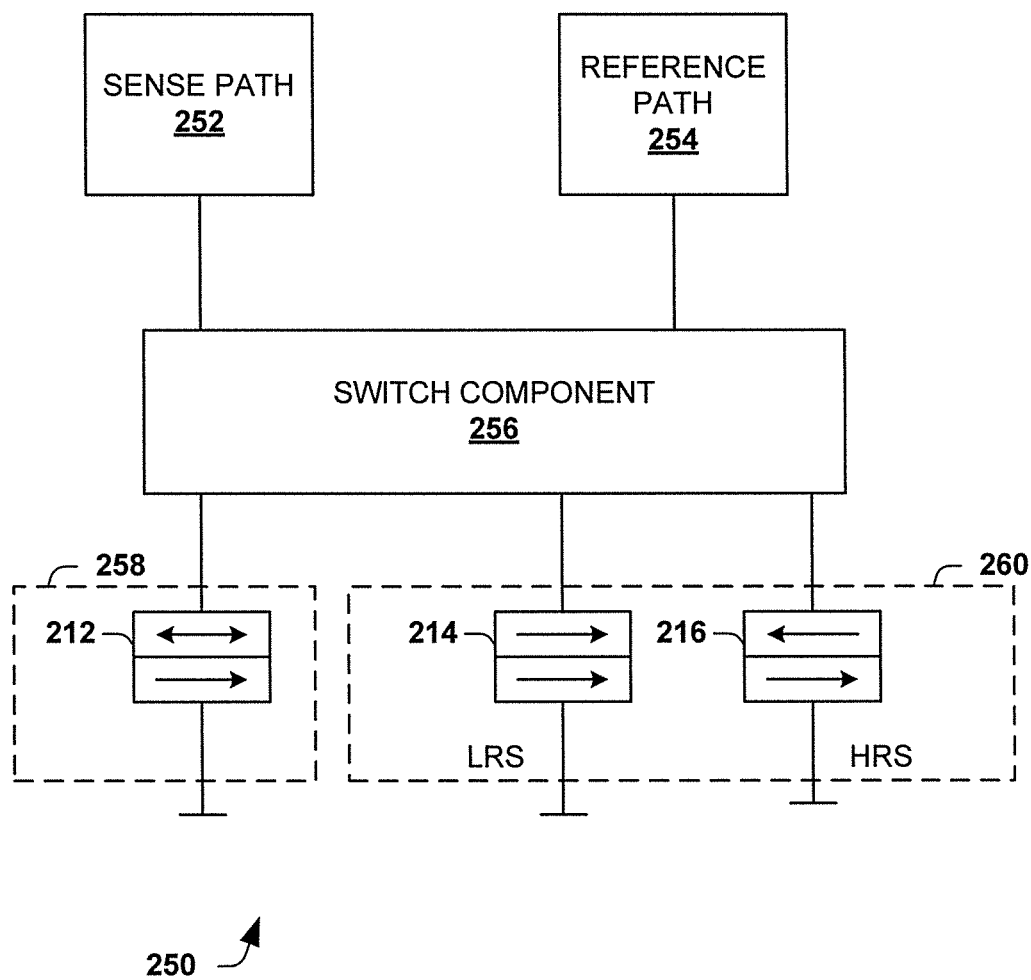
FIG. 2A is a simplified diagram illustrating a sense amplifier system.

FIG. 2A is a simplified diagram illustrating a sense amplifier system 250. The system 250 is shown in a simplified format to facilitate understanding. Further, details of the sense path and the reference path are omitted, however suitable sense and reference paths are described below. The system 250 can be utilized for sensing a resistive memory, including Spin Transfer Torque Magnetoresistive Random Access Memory (STT MRAM) cell, FIS memory, and the like.

The system 250 can be included with other memory related components, such as memory controllers, bitline connections, wordlines, and the like to provide storage and access of information. Further, the system 250 can be incorporated into devices such as mobile phones, computers, positioning devices, media devices, and the like.

The system 250 includes a sense path 252, a reference path 254, a switch component 256, a memory cell 258, and reference cells 260. The sense path 252 and the reference path 254 are utilized to generate various currents and provide output voltages. The memory cell component 258 includes a memory cell, such as the memory cell 212 described below. The reference cells 260 include first and second reference cells, such as a low resistivity reference cell 214 and a high resistivity reference cell 216. The memory cell component 258 and the reference cells 260 are switchably connected to the sense path 252 and the reference path 254 by the switch component 256.

The sense amplifier system 250 operates with two phases in order to provide an output voltage representative of a state of the memory cell component 258. A first phase, referred to as a sampling phase, samples an offset voltage of the sense path 252 and the reference path 254. The offset voltage represents variations in components within the paths, particularly transistor threshold values. A second phase, referred to as the signal amplification phase, utilizes the offset voltage to account for or compensate for the variations. Additional details of the operation of the two phases are provided below.

In a first example, during the sampling phase, the sense path 252 is connected to the reference cells 260 and the reference path 254 is connected to the memory cell component 258. During the signal amplification phase, the sense path 252 is connected to the memory cell component 258 and the reference path 254 is connected to the reference cells 260.

In a second example, the sense path 252 is connected to the memory cell component 258 and the reference path 254 is connected to the reference cells 260 during the sampling phase. Then, during the signal amplification phase, the sense path 252 is connected to the reference cells 260 and the reference path 254 is connected to the memory cell component 258.

Figure 2B:
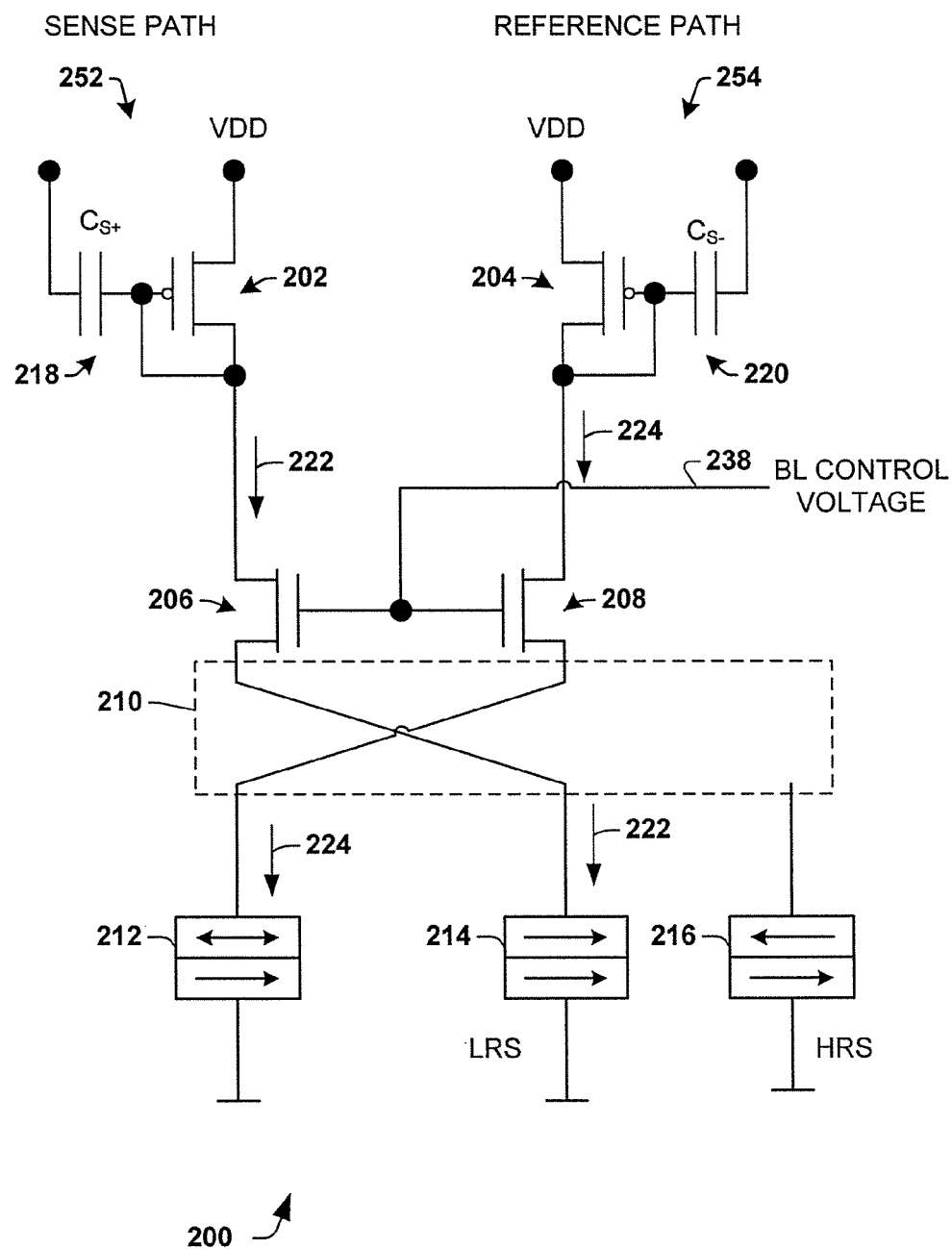
FIGS. 2B and 2C are diagrams illustrating a sense amplifier system utilizing a multiplexed reference cell for an offset sampling phase.
Figure 2C:
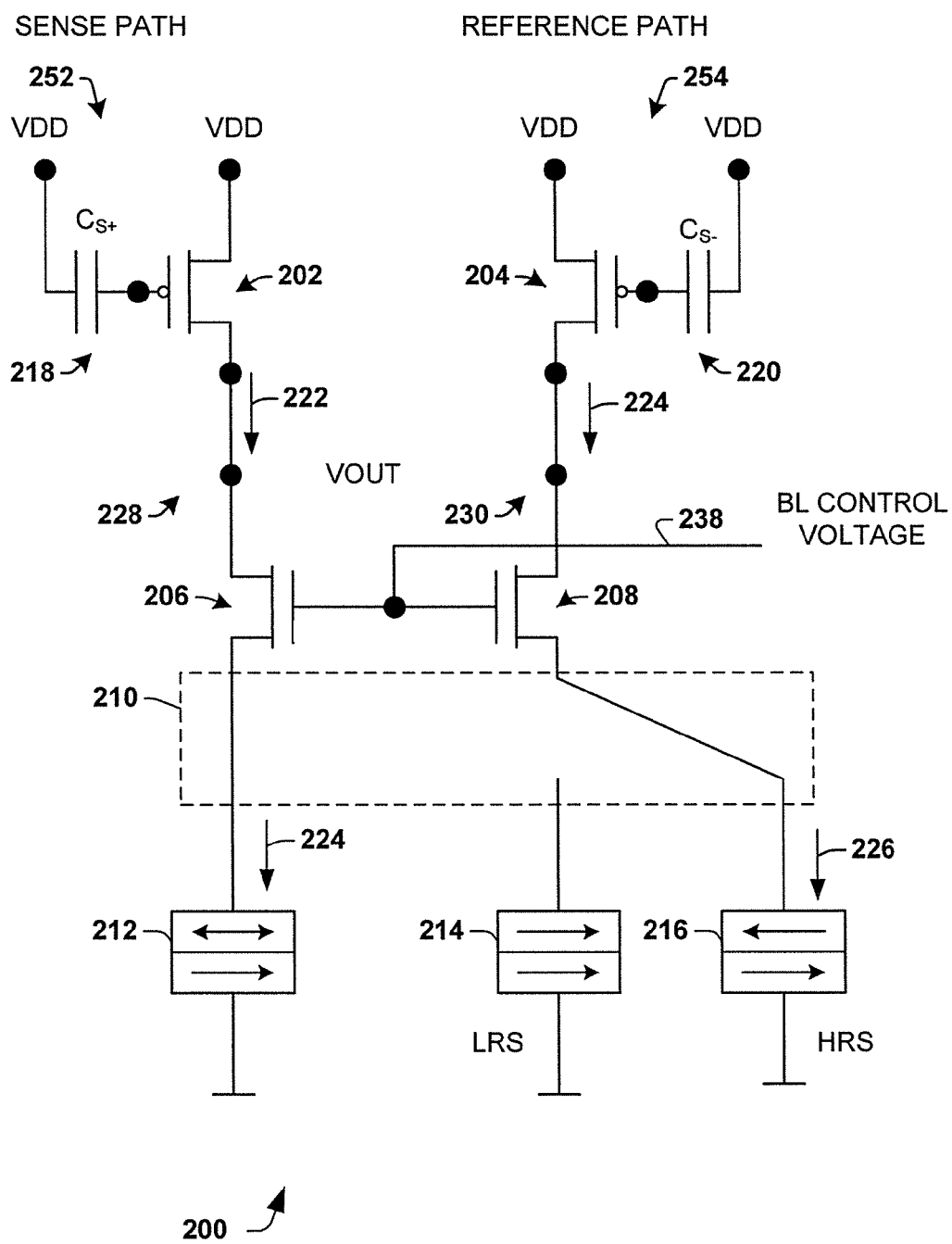

FIGS. 2B and 2C are diagrams illustrating a sense amplifier system 200 utilizing a multiplexed reference cell. The system 200 is similar to the system 250 described above, but is described with additional detail.

The system 200 is described using a full offset cancellation technique (FOCT), in this example. The system 200 can be utilized for sensing a resistive memory, including Spin Transfer Torque Magnetoresistive Random Access Memory (STT MRAM) cell, FIS memory, and the like.

One factor to accurate operation of sense amplifiers is utilizing a well averaged reference current. One way to obtain the equivalent of a well averaged reference current is use reference currents for sense and reference paths. The systems 200 and 250 utilizes a time multiplexed approach wherein one of a high resistivity reference current and a low resistivity reference current is used in an offset sampling phase and the other of the reference currents is used in a signal amplification phase. The paths are the same in each phase, so the difference between measured voltages cancels out the threshold voltage mismatch, referred to as the offset.

FIG. 2B is a diagram illustrating the sense amplifier system 200 utilizing a multiplexed reference cell for an offset sampling phase. The system 200 uses a full offset cancellation technique and a differential structure.

The system 200 includes a first data PMOS transistor 202, a second PMOS transistor 204, a first data NMOS transistor 206, a second data NMOS transistor 208, a memory cell 212, a multiplexor 210 and reference cells 214 and 216. The reference cells include a low resistivity reference cell 214 (RLRS) and a high resistivity reference cell 216 (RHRS). A first capacitor 218 (CS+) is connected to a gate of the transistor 202 and VDD. A second capacitor 220 (CS−) is connected to a gate of the transistor 204 and VDD. The gates are connected to the drains of transistors 202 and 204. The drain of the first PMOS transistor 202 is connected to the drain of the first NMOS transistor 206. The drain of the second PMOS transistor 204 is connected to the drain of the second NMOS transistor 208. Gates of the NMOS transistors 206 and 208 are connected together and are connected to a bitline control voltage 238.

A first path 252, also referred to as a data or sense path, includes the first PMOS transistor 202 and the first NMOS transistor 206. A second path 254, also referred to as a reference path, includes the second PMOS transistor 204 and the second NMOS transistor 208. During the sampling phase, the first path or the data path is connected to a reference cell and the second path or the reference path is connected to the memory cell 212. The reference cell is one of the low resistivity reference cell 214 or the high resistivity reference cell 216.

For the sampling phase, the source of the first NMOS transistor 206 is connected to the reference cell 214 or 216 and the source of the second transistor 208 is connected to the memory cell 212 by the multiplexor 210. A first reference current 222 flows through the sense path via the transistors 202, 206. A data or cell current 224 flows through the second or reference path via the transistors 204, 208, and the memory cell 212.

The first NMOS transistor 206 drives the first reference current 222 to one of the reference cells, which in this example is the low resistivity reference cell. The second NMOS transistor 208 drives the data current 224 to the memory cell. The reference current 222 is shown as being the low resistivity reference current according to the low resistivity cell 214. However, it is appreciated that the reference current 222 can also be a high resistivity reference current according to the high resistivity reference cell 216.

The reference current 222 is saved by means of a voltage (V+) across the first capacitor 218. The data current 224 is by means of a voltage (V−) across the second capacitor 220. The capacitors 218 and 220 are also referred to as offset capacitors. The offset capacitors store the PMOS transistor offset and gate to source voltages of the PMOS transistors 202 and 204 to enable full offset cancellation.

FIG. 2C is a diagram illustrating the sense amplifier system 200 utilizing a multiplexed reference cell for a signal amplification phase. The system 200 uses a full offset cancellation technique.

As stated above, the first path or sense path 252 is defined by the first PMOS transistor 202 and the first NMOS transistor 206. A second path or reference path 254 is defined by the second PMOS transistor 204 and the second NMOS transistor 208. For the signal amplification phase, the first path is coupled to the memory cell 212 and the second path is coupled to an other of the reference cells 214 and 216. The other is the cell that was not utilized in the sampling phase. In this example, the other cell is the high resistivity reference cell 216.

A second reference current 226 is generated according to the other reference cell. In this example, the second reference current 226 is a high resistivity reference current according to the high resistivity reference cell 216. The second reference current 226 is driven by the second NMOS transistor 208 to the high resistivity reference cell 216.

The source of the first NMOS transistor 206 is now connected to the memory cell 212 and the source of the second NMOS transistor 208 is connected to the other reference cell by the multiplexor 210. The first reference current 222 is present at the drain of the first PMOS transistor 202. The data current 224 is pulled through the first NMOS transistor 206 due to its connection to the memory cell 212.

The multiplexor 210 is the switching mechanism that selectively connects the sources of the NMOS transistors to the appropriate or suitable cells of the memory cell 212, the low resistivity reference cell 214 and the high resistivity reference cell 216. It is appreciated that any suitable switching mechanism can be utilized as the multiplexor 210 or in place of the multiplexor 210.

The nodes 228 and 230 provide the voltage output and indicate the state of the memory cell 212. The voltages stored in the capacitors 218 and 220 are used to fully compensate for the offset. The voltage at node 228 indicates the data current 224 subtracted from the first reference current 222 and the voltage at node 230 indicates the second reference current 226 subtracted from the data current 224.

VOUT is provided by nodes 228 and 230. An equation is given by:

$$VOUT = f((I_{DATA} - I_{REF1}) - (I_{REF0} - I_{DATA})) \quad (1)$$

Where $I_{DATA}$ is the data current 224, $I_{REF0}$ is the first reference current 222, and $I_{REF1}$ is the second reference current 226. Then, $$VOUT = f\left(2 * \left(I_{DATA} - \frac{I_{REF0} + I_{REF1}}{2}\right)\right); \quad (2)$$

and $$VOUT = f(2 * (I_{DATA} - I_{REF})) \quad (3);$$

where IREF is an average reference current. Note that IREF is not generated, as in other full offset cancellation techniques (FOCT). Instead, the first and second reference currents 222 and 226 are utilized.

Figure 3A:
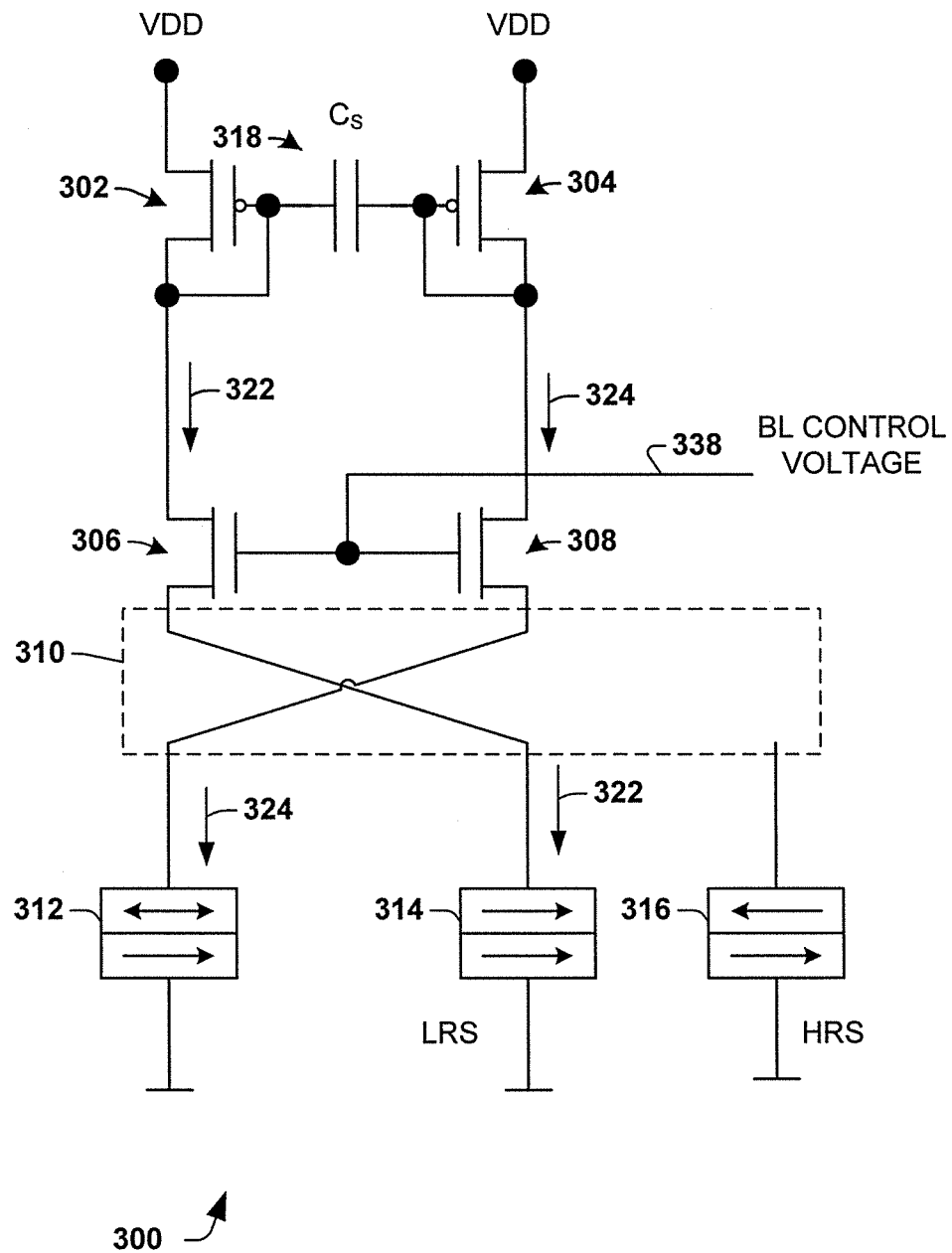
FIGS. 3A and 3B are diagrams illustrating a sense amplifier system utilizing a multiplexed reference cell and a partial offset cancellation technique (POCT).
Figure 3B:
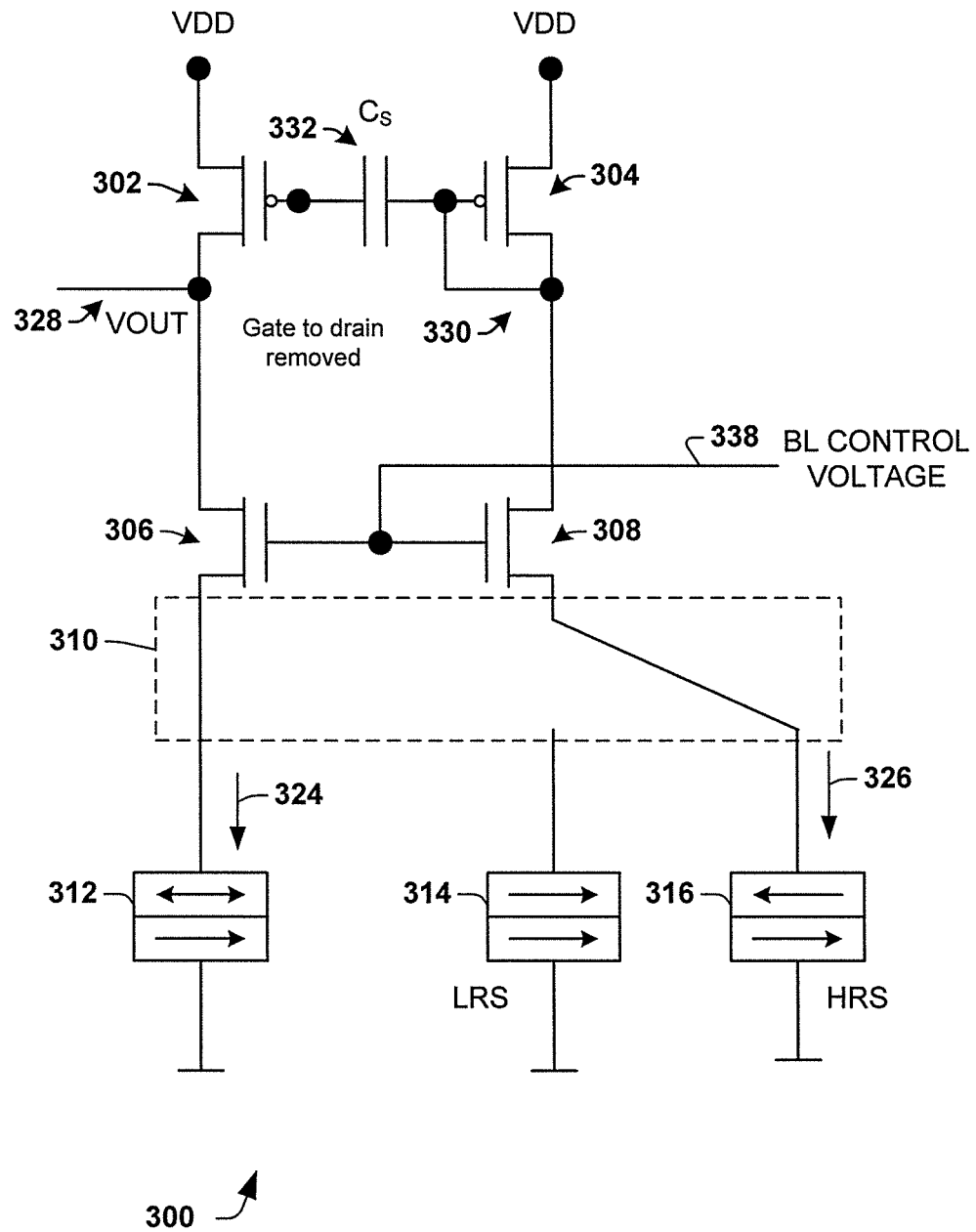

FIGS. 3A and 3B are diagrams illustrating a sense amplifier system 300 utilizing a multiplexed reference cell and a partial offset cancellation technique (POCT). The system 300 can be utilized for sensing a magnetic memory cell, such as a Spin Torque Transfer Magnetoresistive Random Access Memory (STT MRAM) cell.

It is recognized that a memory cell should face the same working conditions as the data path, especially in terms of voltage drop, in order to obtain a well averaged reference current. Therefore, the reference path should be identical to the data path. Thus, a time multiplexed approach is utilized wherein the reference current is not averaged at all.

FIG. 3A is a diagram illustrating the sense amplifier system 300 utilizing a multiplexed reference cell for an offset sampling phase. The system 300 includes a first data PMOS transistor 302, a second PMOS transistor 304, a first data NMOS transistor 306, a second data NMOS transistor 308, a memory cell 312, a multiplexor 310 and reference cells 314 and 316. The reference cells include a low resistivity reference cell 314 (RLRS) and a high resistivity reference cell 316 (RHRS).

A capacitor 318 (CS) is connected to between gates of the transistors 302 and 304. The gate of the first PMOS transistor 302 is connected to the drain of the first PMOS transistor 302. Similarly, the gate of the second PMOS transistor 304 is also connected to its drain.

The drain of the first PMOS transistor 302 is connected to the drain of the first NMOS transistor 306. The drain of the second PMOS transistor 304 is connected to the drain of the second NMOS transistor 308. Gates of the NMOS transistors 306 and 308 are connected together and are connected to a bitline control voltage 338.

A first path, also referred to as a data or sense path, includes the first PMOS transistor 302 and the first NMOS transistor 306. A second path or reference path includes the second PMOS transistor 304 and the second NMOS transistor 308. For the sampling phase, the source of the first NMOS transistor 306 is connected to the reference cell 314 or 316 and the source of the second transistor 308 is connected to the memory cell 312 by the multiplexor 310. A first reference current 322 flows through the sense phase path via the transistors 302, 306 and the reference cells 314. A data current 324 flows through the reference path via the transistors 304, 308, and the memory cell 312. The reference current 322 is shown as being the low resistivity reference current according to the low resistivity cell 314. However, it is appreciated that the reference current 322 can also be a high resistivity reference current according to the high resistivity reference cell 316.

The capacitor 318 stores an offset voltage and signal during the sampling phase. Thus, the capacitor 318 stores the PMOS transistor offset, which is equal to the threshold voltage of the second PMOS transistor 304 subtracted by the threshold voltage of the first PMOS transistor 302.

FIG. 3B is a diagram illustrating the sense amplifier system 300 utilizing a multiplexed reference cell for a signal amplification phase and partial offset cancellation technique. The system 300 uses a differential structure.

As described above, the first path or sense path includes the first PMOS transistor 302 and the first NMOS transistor 306. The second path or reference path includes the second PMOS transistor 304 and the second NMOS transistor 308. The first path is coupled to the memory cell 312 and the second path is coupled to an other of the reference cells 314 and 316. The other is the reference cell that was not utilized in the sampling phase. In this example, the other cell is the high resistivity reference cell 316. It is noted that the gate to drain connection of the first PMOS transistor is not shown for the signal amplification phase.

A second reference current 326 is generated using the other reference cell. In this example, the second reference current 326 is a high resistivity reference current according to the high resistivity reference cell 316.

For the signal amplification phase, the source of the first NMOS transistor 306 is connected to the memory cell 312 and the source of the second NMOS transistor 308 is connected to the other reference cell by the multiplexor 310. The data current 324 is pulled through the first NMOS transistor 306 due to its connection to the memory cell 312.

The multiplexor 310 is the switching mechanism that selectively connects the sources of the NMOS transistors 306 and 308 to the appropriate or suitable cells of the memory cell 312, the low resistivity reference cell 314 and the high resistivity reference cell 316. It is appreciated that any suitable switching mechanism can be utilized as the multiplexor 310 or in place of the multiplexor 310.

An output voltage is provided at output nodes 328 and 330. The output voltage indicates the state of the memory cell 312 and accounts for threshold voltage variations in the transistors. The output voltage is provided as shown above in equations (1), (2), and (3).

Other partial offset cancellation techniques (POCT) require generation of an average current for the reference current. Creation of an average reference current requires additional components and complexity.

Figure 4A:
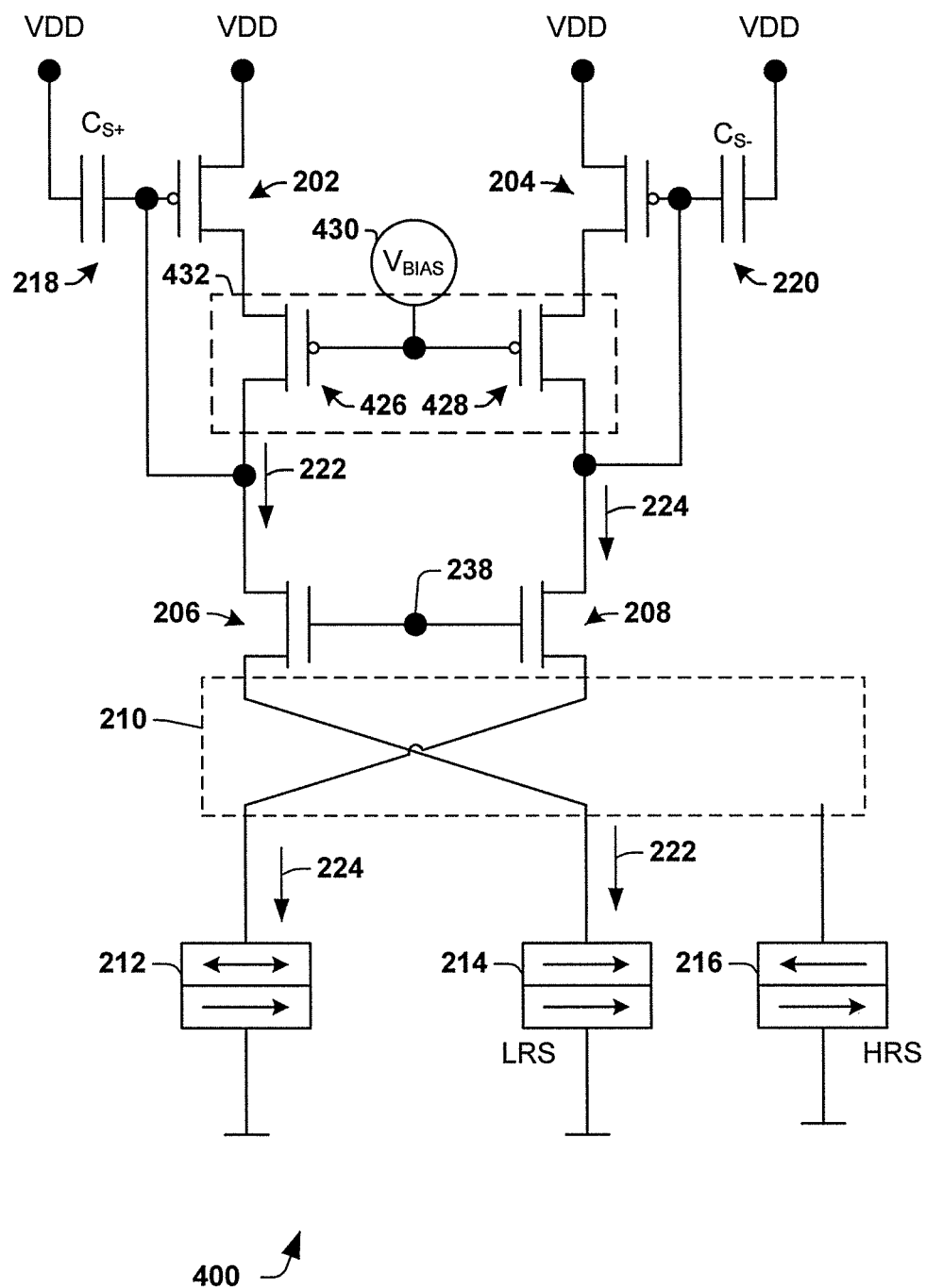
FIGS. 4A and 4B are diagrams illustrating a sense amplifier system utilizing cascoded PMOS transistors and a full offset cancellation technique. (FOCT).
Figure 4B:
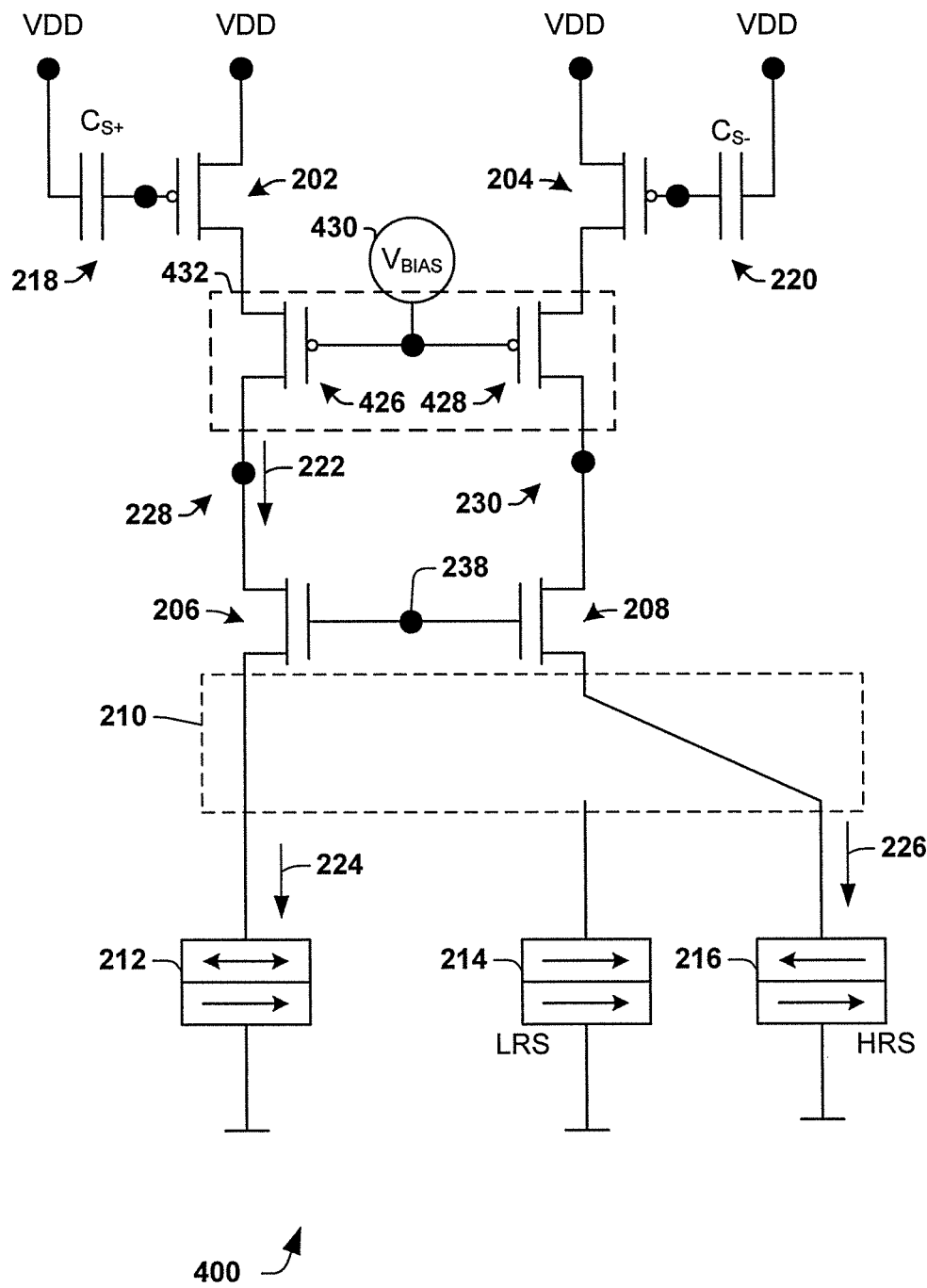

FIGS. 4A and 4B are diagrams illustrating a sense amplifier system 400 utilizing cascoded PMOS transistors and full offset cancellation technique (FOCT). The system 400 utilizes a multiplexor mechanism to switch reference cells and a memory cell. The system 400 also incorporates cascoded PMOS transistors to further increase a gain of the system. A description of some the reference items is omitted here and is presented above in conjunction with the description of FIGS. 2B and 2C.

FIG. 4A is a diagram illustrating the sense amplifier system 400 using cascode transistors for an offset sampling phase. As stated above, the system 400 combines multiplexing reference and memory cells with cascode transistors for FOCT.

The multiplexor mechanism 210 couples the sense path, which includes the first cascode transistor 426, to one of the reference cells 214 during the sampling phase. Additionally, the multiplexor mechanism 210 couples the reference path, which includes the second cascode transistor 428, to the memory cell 212 during the sampling phase.

A wide swing cascode structure 432 is included to increase the gain of the system 400. The cascode structure 432 is positioned between the first and second PMOS transistors 202 and 204 and the first and second NMOS transistors 206 and 208.

The cascode structure 432 includes a bias voltage 430 (VBIAS), a first cascode transistor 426 and a second cascode transistor 428. The bias voltage 430 is provided to gates of the cascode transistors 426 and 428, which are also connected to each other. The first cascode transistor 426 has its drain connected to the drain of the first NMOS transistor 206 and the second cascode transistor 428 has its drain connected to the drain of the second NMOS transistor 208.

FIG. 4B is another diagram illustrating the sense amplifier system 400 incorporating a cascode structure for a signal amplification phase. In the signal amplification phase, an output voltage VOUT is provided that indicates the content of the memory cell 212 using equations (1) to (3), as described above.

Here, the multiplexor mechanism 210 couples the sense path to the memory cell 212 and the reference path to an other of the reference cells 214 and 216. The other is the one that was not coupled to in the sampling phase.

Gate to source connections of the PMOS transistors 202 and 204 to the cascode transistors 426 and 428 are not required for this phase. VOUT is provided at nodes 228 and 230.

As stated above, the cascode structure 432 increases gain for the sense amplifier system 400. Additionally, the cascode structure 432 tends to lower the offset because the bias voltage 430 is provided by a separate circuit. Thus, the structure 432 doesn't track variations present in other portions of the system 400. However, it is noted that the structure 432 does increase the complexity of the design by adding two transistors and a voltage source.

Figure 5A:
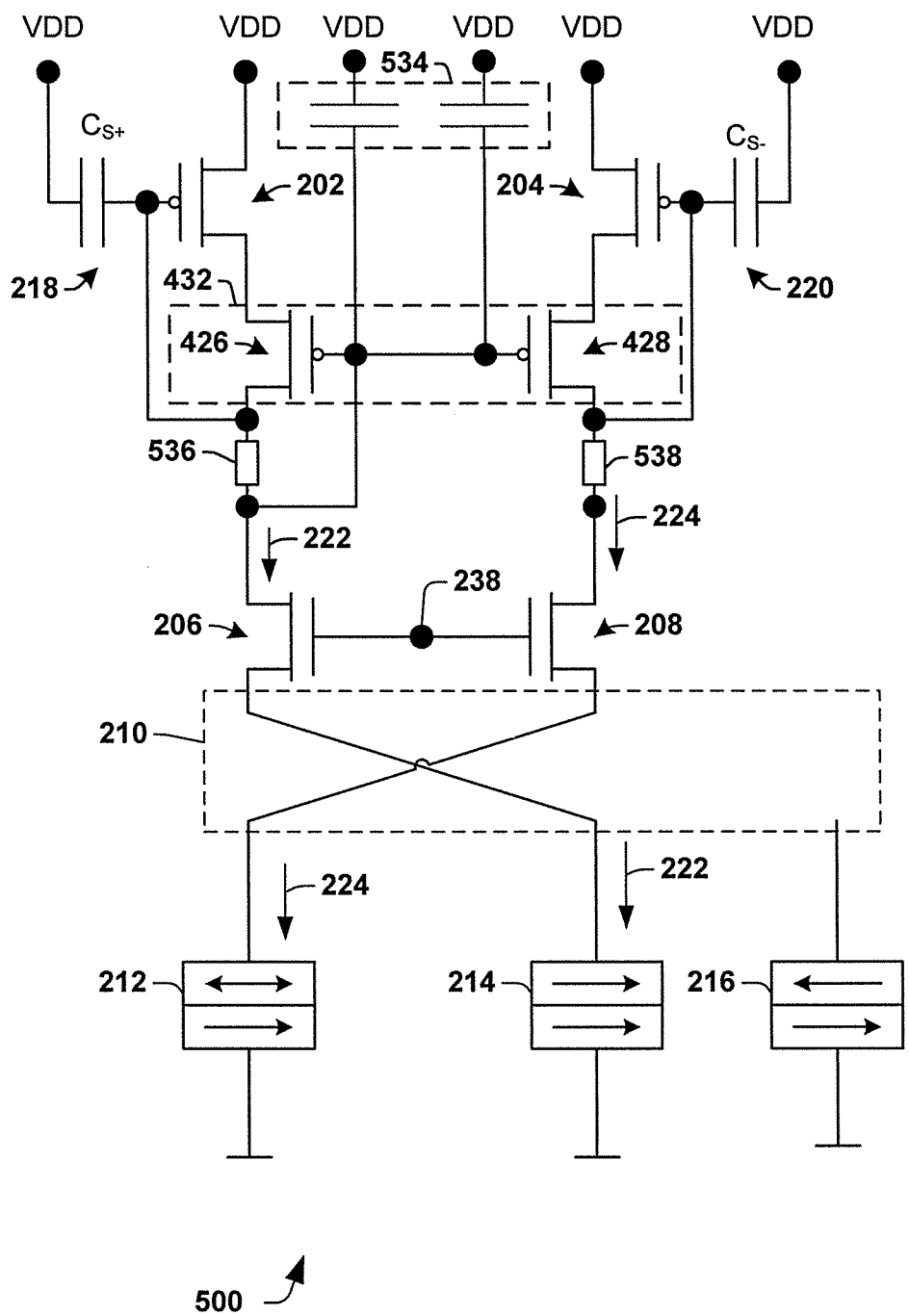
FIGS. 5A and 5B are diagrams illustrating a sense amplifier system utilizing cascoded PMOS transistors and bias capacitors.
Figure 5B:
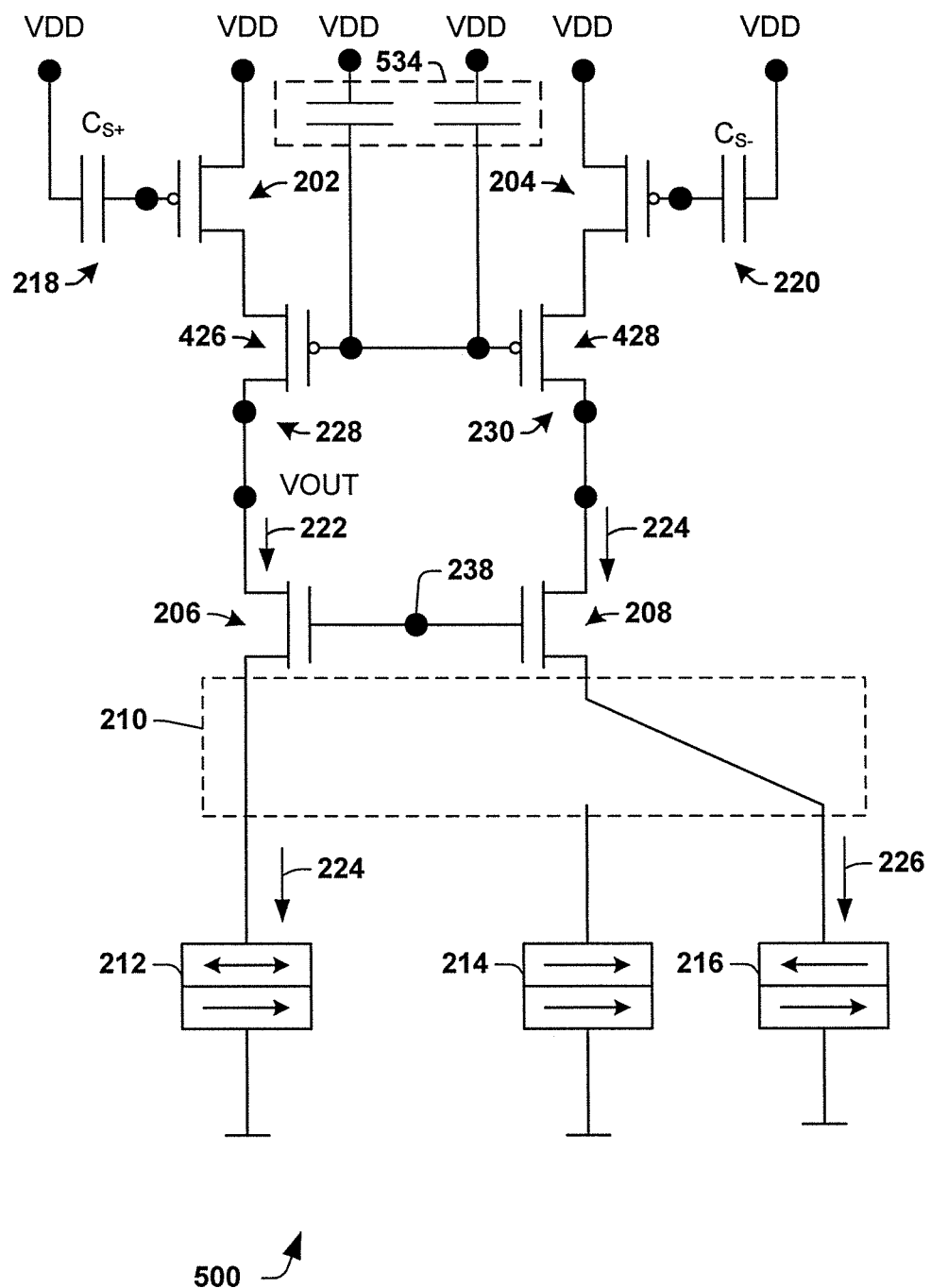

FIGS. 5A and 5B are diagrams illustrating a sense amplifier system 500 utilizing cascoded PMOS transistors and bias capacitors. The system 500 utilizes full offset cancellation technique (FOCT) and a multiplexor mechanism to switch reference cells and a memory cell. The system 500 incorporates bias capacitors instead of using a bias voltage source as is used in system 400 described above. The bias capacitors 534 facilitate using cascoded transistors to further increase a gain of the system while mitigating complexity. A description of some of the reference items is omitted here and is presented above in conjunction with the description of FIGS. 2B and 2C and 4A and 4B.

FIG. 5A is a diagram illustrating a sense amplifier system 500 using cascode transistors and bias capacitors for a sampling phase. The system 500 includes the cascode transistors 426 and 428 and the cascode structure 432, as described above. The multiplexor mechanism 210 couples the sense path to one of the reference cells 214 during the sampling phase. Additionally, the multiplexor mechanism 210 couples the reference path to the memory cell 212 during the sampling phase.

Instead of using a bias voltage source, bias capacitors 534 are used to obtain a voltage bias to be used by the cascode structure 432, which includes transistors 426 and 428, during a signal amplification phase. Each of the bias capacitors is connected to a separate supply voltage VDD and a gate of transistor 426 or 428. The cascode structure 432 and bias capacitors 534 provide more voltage headroom to PMOS transistors 202 and 204.

FIG. 5B is a diagram illustrating the sense amplifier system using cascode transistors and bias capacitors for a signal amplification phase.

Here, the multiplexor mechanism 210 couples the sense path to the memory cell 212 and the reference path to an other of the reference cells 214 and 216. The other is the one that was not coupled to in the sampling phase.

The voltage bias obtained by the bias capacitors 534 during the sampling phase is used here in the signal amplification phase. The voltage bias is provided by the bias capacitors to the cascode transistors 426 and 428. The bias resistors 536 and 538 can be shorted or removed during the signal amplification phase to improve output swing capabilities of the system 500 and further reduce overall offset. However, it is appreciated that the bias resistors 536 and 538 can remain.

The cascode structure 432 described above facilitates resistance or immunity to noise, including kick back noise. As a result, the offset capacitors 218 and 220 ($C_{S+}$ and/or $C_{S-}$) can be shrank or scaled down without reducing performance. Further, the overall size increase using the extra capacitors is relatively moderate.

The system 500 provides high gain and the output voltage is taken between 228 and 230. However, the high gain can lead to saturation where one or both of the nodes are moved towards a rail, either VDD or GND. This is referred to as saturation and lowers the read window.

Figure 6A:
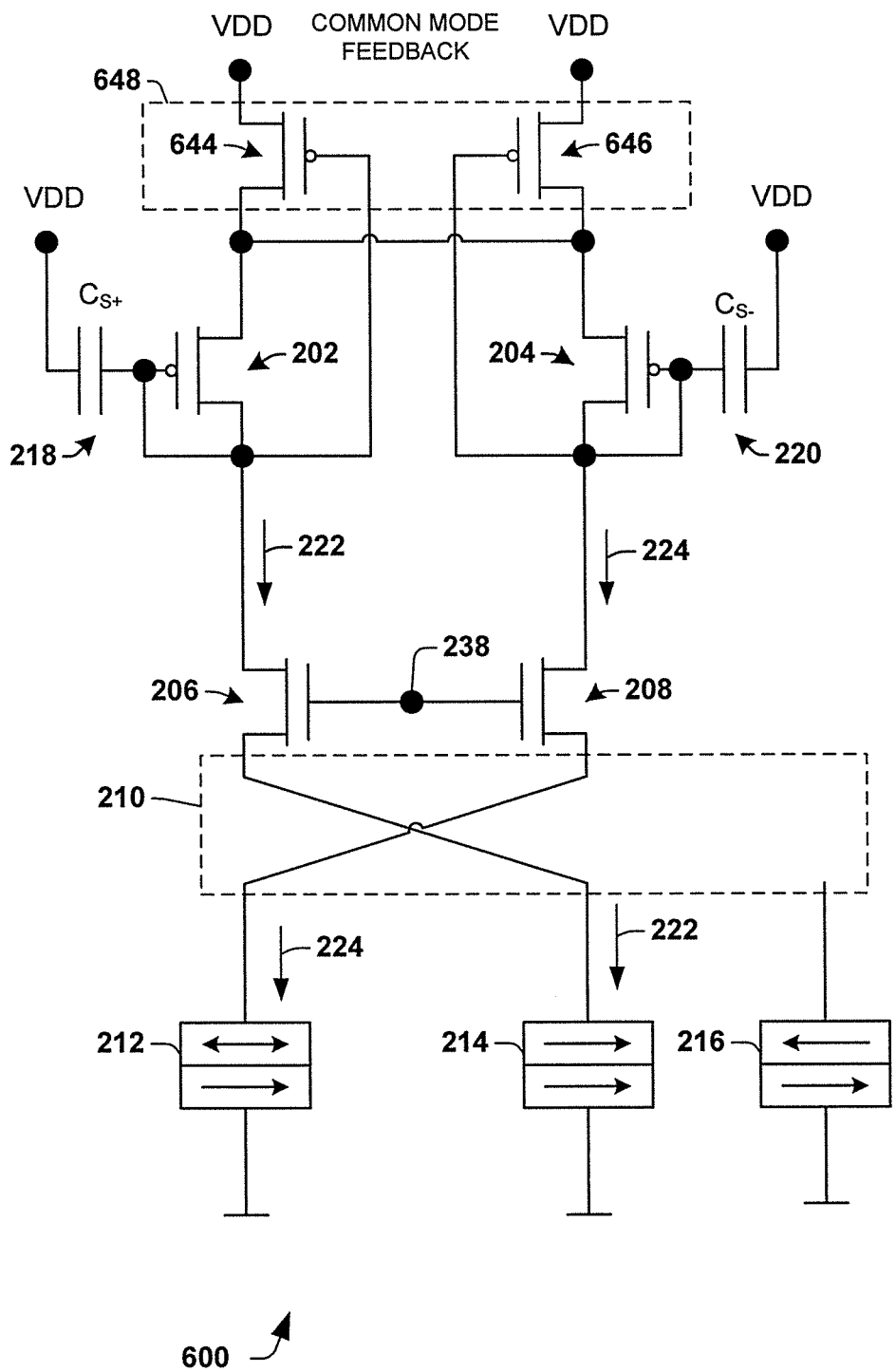
FIGS. 6A and 6B are diagrams illustrating a sense amplifier system utilizing common mode feedback (CMFB).
Figure 6B:
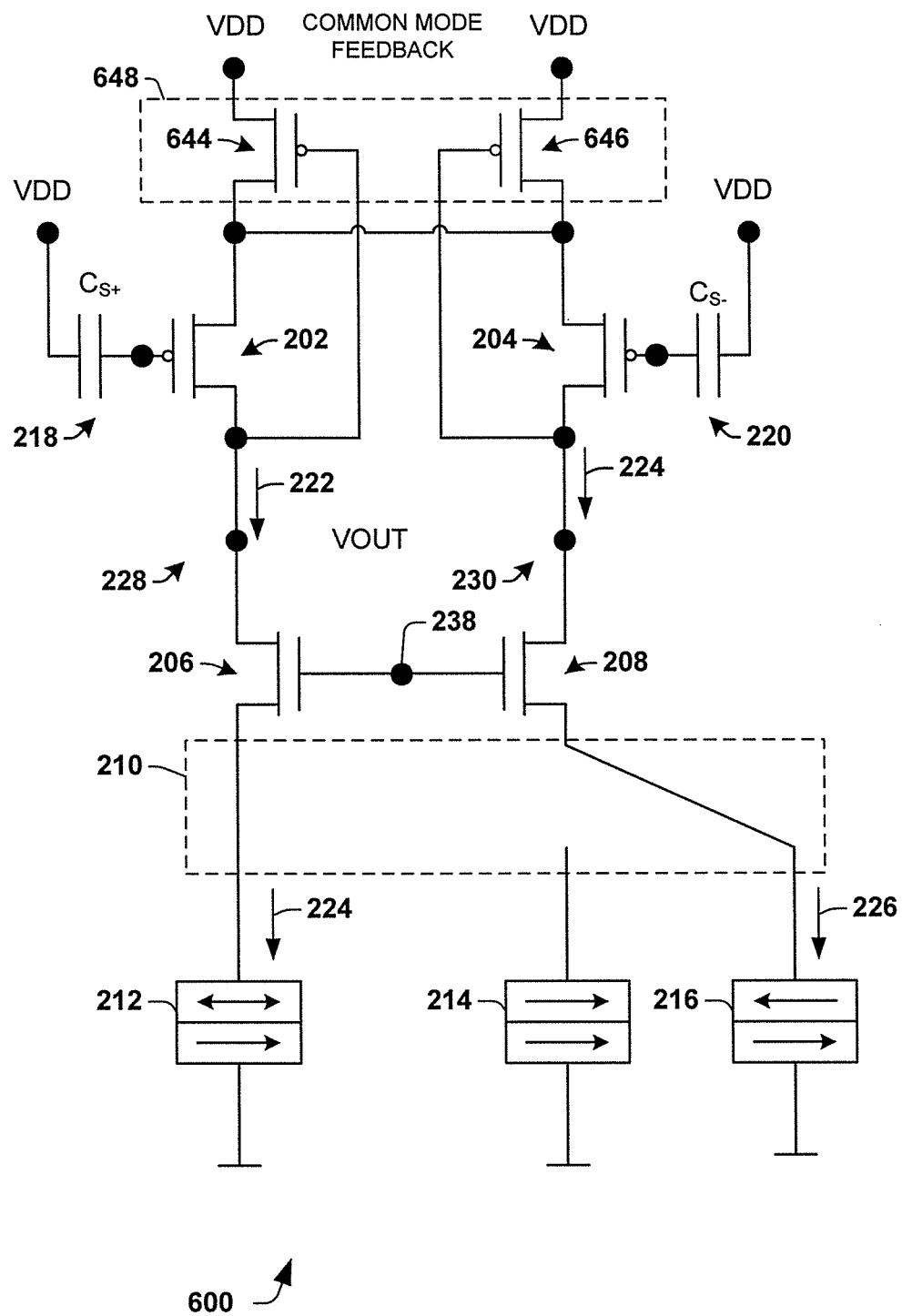

FIGS. 6A and 6B are diagrams illustrating a sense amplifier system 600 utilizing common mode feedback (CMFB). The system 600 utilizes full offset cancellation technique (FOCT) and a multiplexor mechanism to switch reference cells and a memory cell. The CMFB mitigates saturation caused by the high gain of the cascode structure. A description of some the reference items shown is omitted here and is presented above in conjunction with the description of FIGS. 2B and 2C.

FIG. 6A is a diagram illustrating a sense amplifier system 600 using common mode feedback for a sampling phase. The multiplexor mechanism 210 couples the sense path to one of the reference cells 214 and the reference path to the memory cell 212 during the sampling phase.

The system 600 includes a common mode feedback (CMFB) structure 648. The CMFB 648 includes a first CMFB transistor 644 and a second CMFB transistor 646. The first CMFB transistor is connected to the source of the first PMOS transistor 202 and the second CMFB transistor 646 is connected to the source of the second PMOS transistor 204. The drains of the CMFB transistors 644 and 646 are shorted.

FIG. 6B is a diagram illustrating the sense amplifier system 600 using common mode feedback for a signal amplification phase. The multiplexor mechanism 210 couples the reference path to an other of the reference cells 214 and 216 and the sense path to the memory cell 212 during the signal amplification phase. The other is the reference cell not utilized during the sampling phase by the system 600, but can be used or shared by another sense amplifier system.

As long as the drains of the CMFB transistors 644 and 646 are shorted, the common mode feedbacks for the sense path and the reference path are identical. The CMFB transistors 644 and 646 are also connected to output voltage nodes.

Figure 7A:
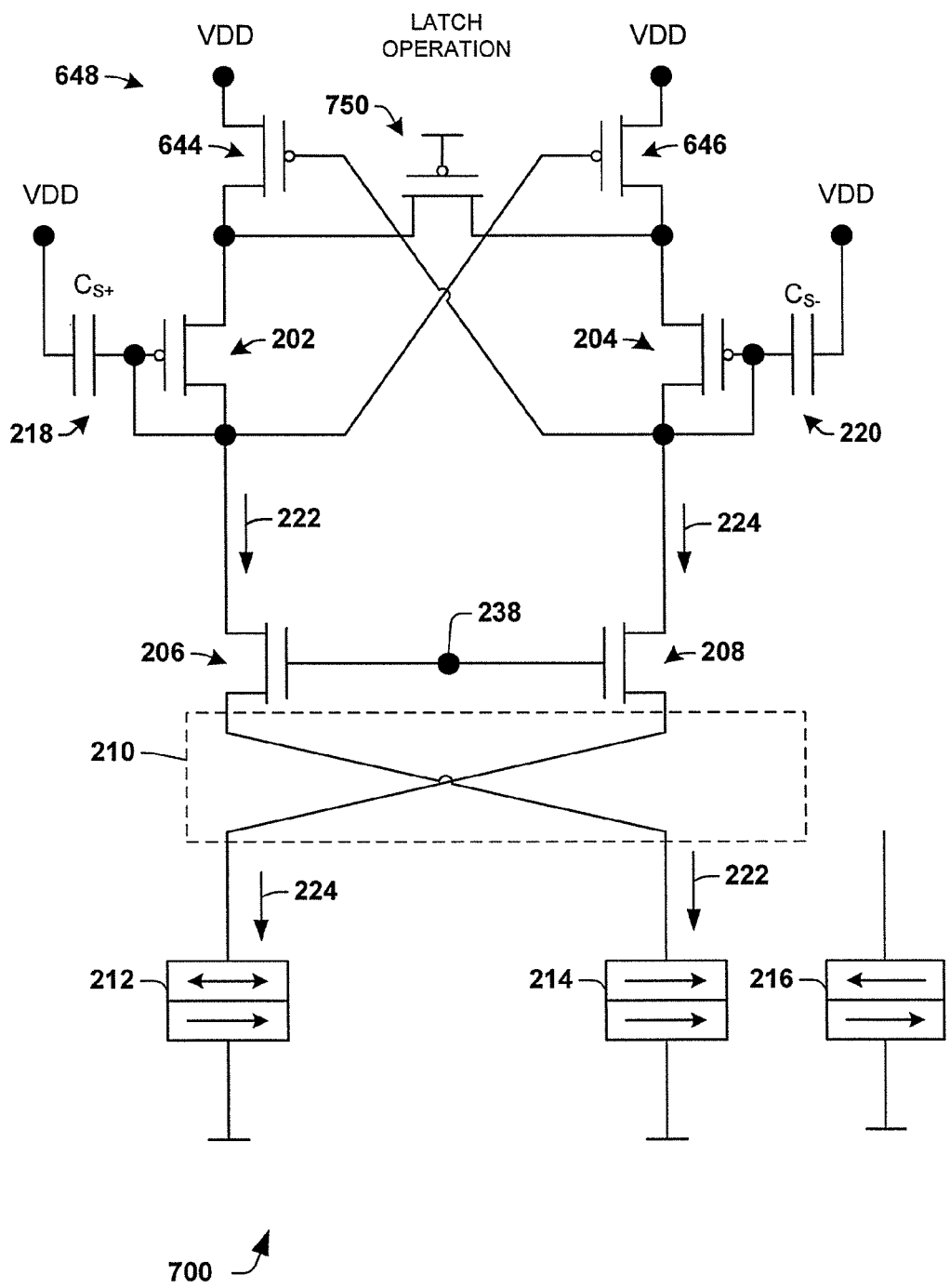
FIGS. 7A and 7B are diagrams illustrating a sense amplifier system utilizing cross coupled common mode feedback (CMFB) and a latch.
Figure 7B:
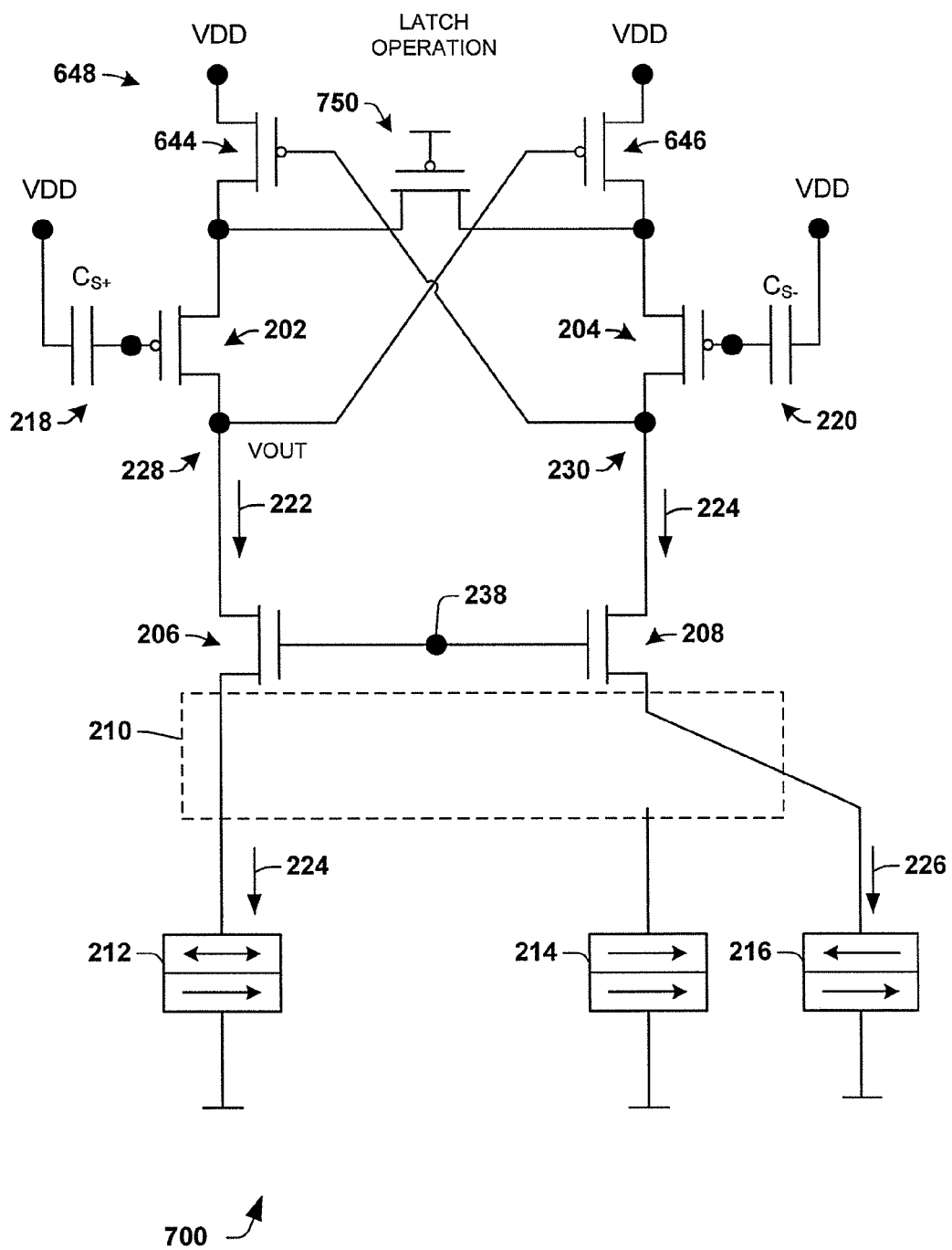

FIGS. 7A and 7B are diagrams illustrating a sense amplifier system 700 utilizing cross coupled common mode feedback (CMFB) and a latch. The system 700 utilizes full offset cancellation technique (FOCT) and a multiplexor mechanism to switch reference cells and a memory cell. The CMFB mitigates saturation due to common mode variations. A description of some the reference items omitted here and can be referenced above in conjunction with the description of FIGS. 2B, 2C, 6A, and 6B.

FIG. 7A is a diagram illustrating a sense amplifier system 700 using a latch and cross coupled CMFB for a sampling phase. The multiplexor mechanism 210 couples the sense path to one of the reference cells 214 and the reference path to the memory cell 212 during the sampling phase.

The system 700 includes a common mode feedback (CMFB) structure 648 and a latch mechanism 750. The CMFB 648 includes a first CMFB transistor 644 and a second CMFB transistor 646. The first CMFB transistor 644 is connected to the source of the first PMOS transistor 202 and the second CMFB transistor 646 is connected to the source of the second PMOS transistor 204. The drains of the CMFB transistors 644 and 646 are connected to the latch mechanism 750.

The gates of the CMFB transistors 644 and 646 are cross coupled to the drains of the PMOS transistors 202 and 204. Thus, the gate of the first CMFB transistor 644 is connected to the drain of the second PMOS transistor 204 and the gate of the second CMFB transistor 646 is connected to the drain of the first PMOS transistor 202.

The latch mechanism 750 includes a PMOS latch transistor connected to ground or a supply voltage (VDD). The gate of the latch transistor is selectively connected to ground or VDD. For the sampling phase, the gate of the latch transistor is connected to ground to enable CMFB operation.

FIG. 7B is a diagram illustrating the sense amplifier system 700 using a latch and cross coupled CMFB for a signal amplification phase. The multiplexor mechanism 210 couples the reference path to an other of the reference cells 214 and 216 and the sense path to the memory cell 212 during the signal amplification phase. The other is the reference cell not utilized during the sampling phase.

As shown above, the gates of CMFB transistors 644 and 646 are also cross coupled to the drains of PMOS transistors 202 and 204 and to output voltage nodes 228 and 230. The latch mechanism 750 is selectively coupled to one of ground or VDD. The latch mechanism incorporates a latch operation mode into the system 700. This introduces a positive feedback by driving the latch 750 gate to VDD.

The system 700 has both a CMFB mode and a latch operation mode. These modes lead to a wide output voltage swing that can be directly used by another circuit and can avoid requiring a second stage sense amplifier. Further, the system 700 can consume less power and silicon area while providing the same or similar performance of a two stage sense amplifier.

Figure 8A:
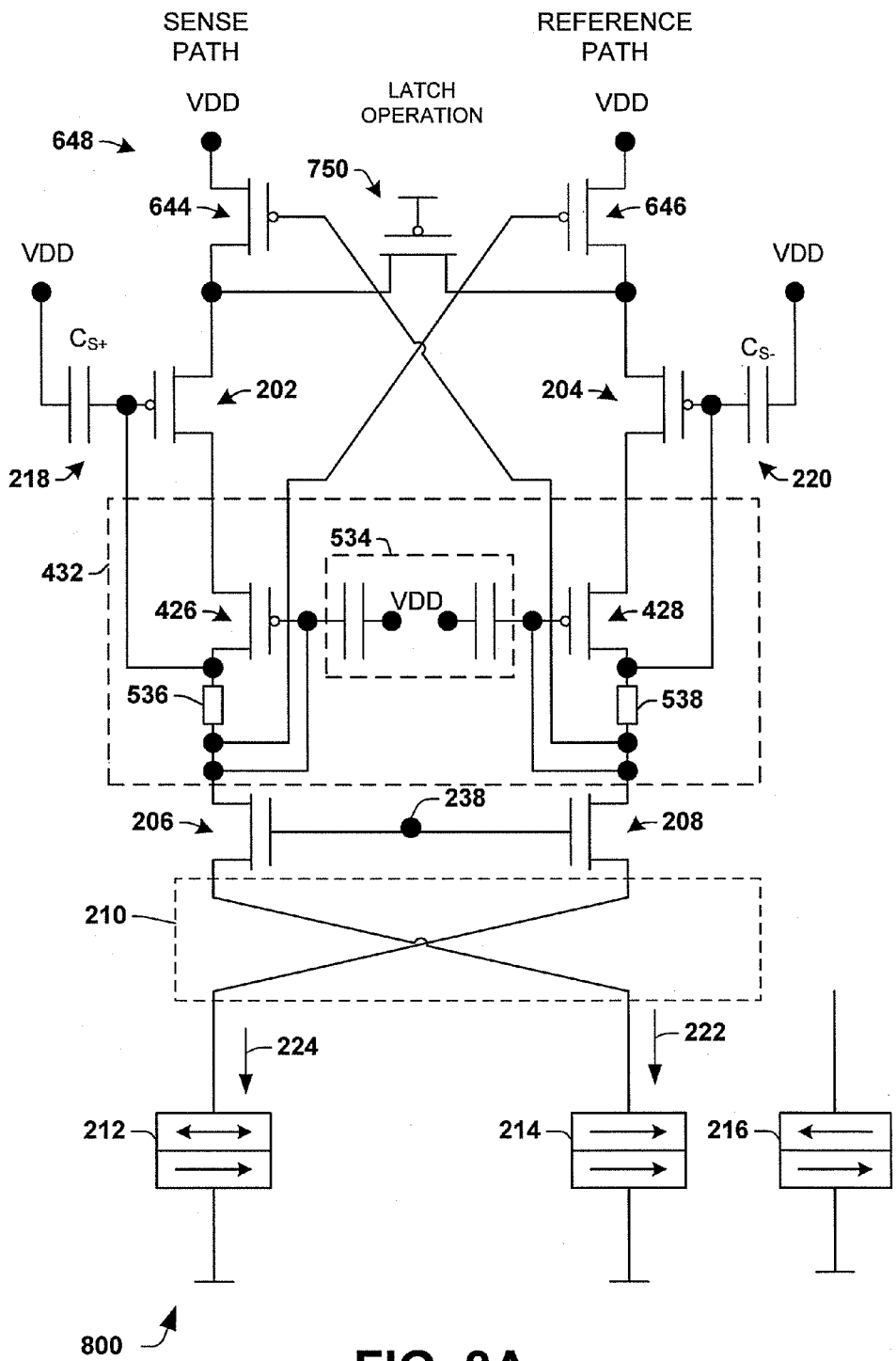
FIGS. 8A and 8B are diagrams illustrating a sense amplifier system utilizing a multiplexed reference cell, a self biased cascode structure, CMFB, and a latch mode.
Figure 8B:
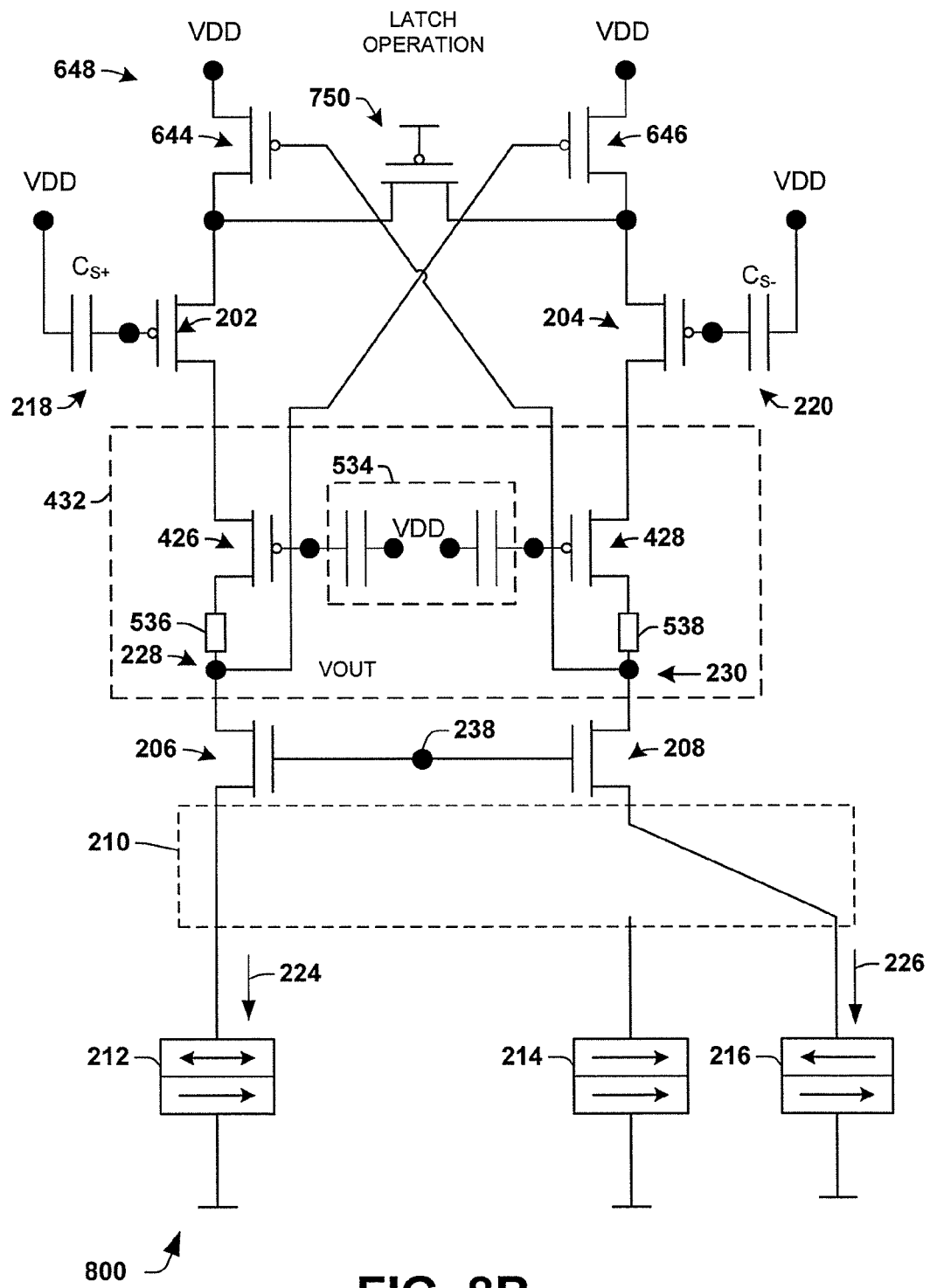

FIGS. 8A and 8B are diagrams illustrating a sense amplifier system 800 utilizing a multiplexed reference cell, a self biased cascode structure, and dual mode operation. The system 800 utilizes full offset cancellation technique (FOCT) and a multiplexor mechanism to switch reference cells and a memory cell. The CMFB mitigates saturation due to common mode variations. A description of some the reference items shown is omitted here and is presented above in conjunction with the description of FIGS. 2B, 2C, 6A, 6B, 7A, and 7B.

FIG. 8A is a diagram illustrating a sense amplifier system 800 using a latch for a sampling phase. The system 800 includes a multiplexor mechanism 210, offset capacitors 218 and 220, a cascode structure 432, a common mode feedback (CMFB) structure 648 and a latch mechanism 750. The multiplexor mechanism 210 couples the sense path to one of the reference cells 214 and the reference path to the memory cell 212 during the sampling phase.

The cascode structure 432 is a wide swing cascode structure and is included to increase the gain of the system 800. The cascode structure 432 is positioned between the first and second PMOS transistors 202 and 204 and the first and second data NMOS transistors 206 and 208.

The CMFB 648 includes a first CMFB transistor 644 and a second CMFB transistor 646. The first CMFB transistor 644 is connected to the source of the first PMOS transistor 202 and the second CMFB transistor 646 is connected to the source of the second PMOS transistor 204. The drains of the CMFB transistors 644 and 646 are connected to a latch mechanism 750.

The gates of the CMFB transistors 644 and 646 are cross coupled to the drains of the PMOS transistors 426 and 426 through resistors 536 and 538. Thus, the gate of the first CMFB transistor 644 is connected to the drain of the second PMOS transistor 428 and the gate of the second CMFB transistor 646 is connected to the drain of the second PMOS transistor 426.

The latch mechanism 750 includes a PMOS latch transistor connected to ground or a supply voltage (VDD). The gate of the latch transistor is selectively connected to ground or VDD. For the sampling phase, the gate of the latch transistor is connected to ground.

Bias capacitors 534 are used to obtain two voltage biases, which are used by the cascode structure 432, which includes transistors 426 and 428. Instead of being connected to separate supply voltages, each of the bias capacitors 534 is connected to the same supply voltage VDD and the gate of transistors 426 and 428 as shown. The bias capacitors 534 facilitate self setting gate voltages of the cascoded transistors 426 and 428.

FIG. 8B is a diagram illustrating the sense amplifier system 800 using a multiplexed reference cell, a self biased cascode structure, and dual mode operation for a signal amplification phase.

The multiplexor mechanism 210 couples the reference path to an other of the reference cells 214 and 216 and the sense path to the memory cell 212 during the signal amplification phase. The other is the reference cell not utilized during the sampling phase. An output voltage (VOUT) is provided at nodes 228 and 230.

The multiplexor mechanism 210, offset capacitors 218 and 220, a cascode structure 432, a common mode feedback (CMFB) structure 648 and a latch mechanism 750 are utilized in this example. The offset capacitors 218 and 220 facilitate full offset cancellation for the sampling phase. The cascode structure facilitates amplifier gain and the like. The common mode feedback structure 648 mitigates signal clamping by preventing the common mode voltage from drifting. The latch mechanism 750 facilitates gain and permits avoidance of a second stage for amplification of the output VOUT.

The system 800 utilizes the techniques described above including a multiplexed reference cell, a self biased cascode structure, CMFB mode, and a latch mode. The system 800 is shown utilizing all the techniques, however it is appreciated that some, all, or other combinations of the techniques are contemplated for other sense amplifier systems.

Figure 8C:
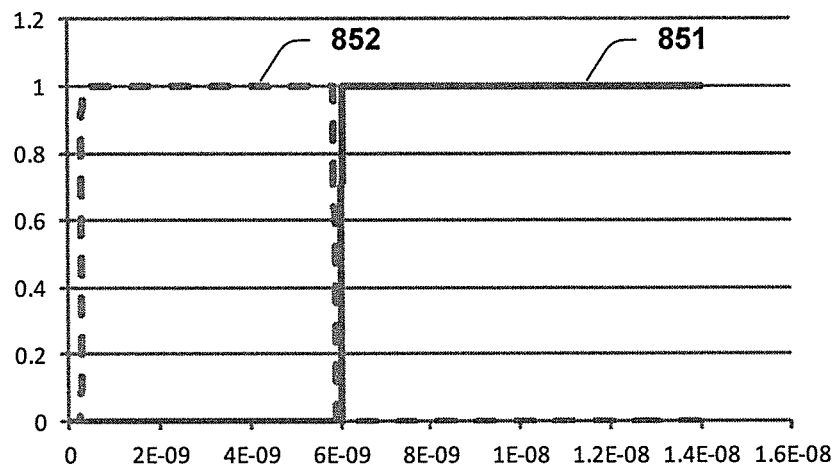
FIGS. 8C, 8D, and 8E are graphs illustrating example voltages and currents for a sense amplifier system.

FIG. 8C is a graph illustrating example control signals that can be utilized in a sense amplifier system. The control signals can be utilized by the above sense amplifier systems and variations thereof. The control signals are provided as an example to facilitate understanding. FIGS. 8A and 8B can be referenced in conjunction with the graph.

The graph depicts time on an x-axis and voltage on a y-axis. Line 852 is a control signal that activates a first phase or sense phase. Line 851 is a control signal that activates a second phase or signal amplification phase. The control signals can be connected to the multiplexor 210 to control operation thereof.

Figure 8D:
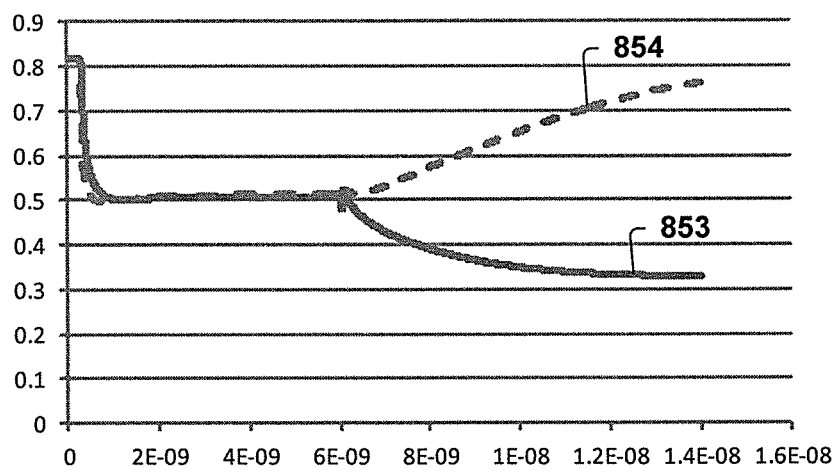

FIG. 8D is a graph illustrating example output node voltages that can be obtained in a sense amplifier system. The output voltages can be generated by the above sense amplifier systems and variations thereof. The output voltages are provided as an example to facilitate understanding. FIGS. 8A and 8B can be referenced in conjunction with the graph.

The graph depicts time on an x-axis and voltage on a y-axis. Line 853 is a first output node voltage and line 854 is a second output node voltage. For example, the first output node voltage could correspond to node 228 of FIG. 8B and the second output node voltage could correspond to node 230 of FIG. 8B. In a first phase, the output voltages have an initial transient portion and then converge towards a DC value. In a second phase (signal amplification phase), the voltages diverge thereby permitting a differential voltage measurement, which indicates a state of a memory cell.

Figure 8E:
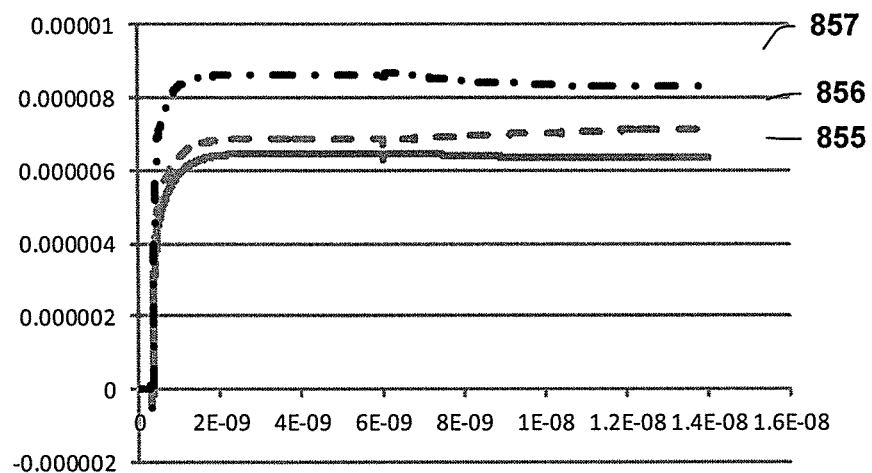

FIG. 8E is a graph illustrating example currents that can occur in a sense amplifier system. The currents can be utilized by the above sense amplifier systems and variations thereof and are provided as an example to facilitate understanding. FIGS. 8A and 8B can be referenced in conjunction with the graph.

The graph depicts time on an x-axis and current on a y-axis. Line 855 represents a high resistivity reference current, line 856 represents a data current, and line 857 represents a low resistivity reference current. It can be seen that the data current 856 is between the high resistivity reference current 855 and the low resistivity reference current 857.

Figure 9:
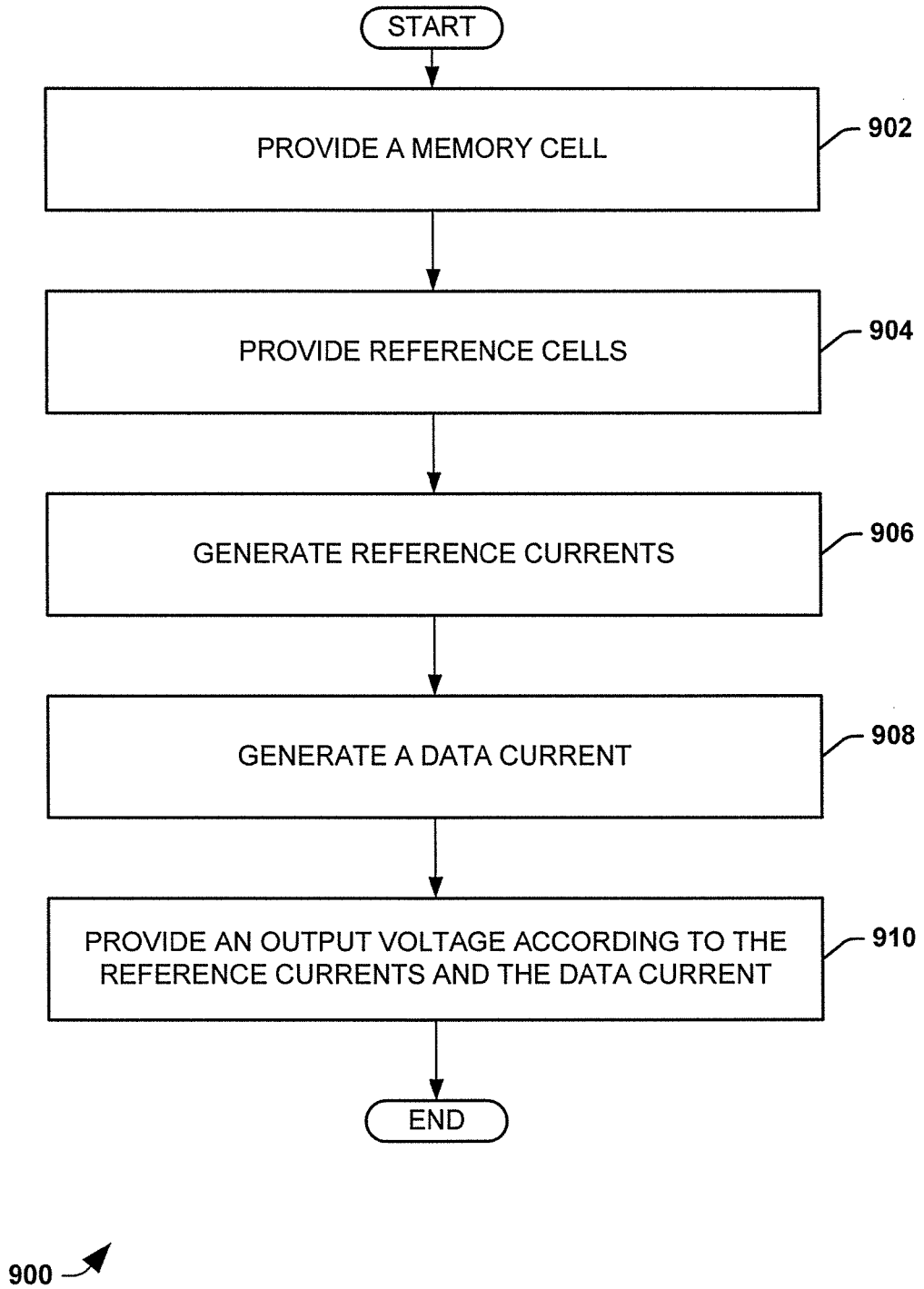
FIG. 9 is a flow diagram illustrating a method of operating a sense amplifier.

FIG. 9 is a flow diagram illustrating a method 900 of operating a sense amplifier. The method 900 uses a multiplexing technique for a memory cell and reference cells to facilitate operation.

The method 900 begins at block 902, wherein a memory cell is provided. Reference cells are provided at block 904. The memory cell can be a magneto resistive memory cell. The memory cell has a state or logical state stored therein. The reference cells include a low resistivity reference cell and a high resistivity reference cell.

First and second reference currents are generated at block 906 using the reference cells. The first and second reference currents include a low resistivity reference current and a high resistivity reference current. The low resistivity reference current is generated using the low resistivity reference cell and the high resistivity reference current is generated using the high resistivity reference cell. Generally, the first reference current is generated during a sampling phase and the second reference current is generated during a signal amplification phase. By using both reference currents, generation of an average reference current is not needed.

A data current is generated at block 908. The data current is generated using the memory cell and is generated in both the sampling phase and the signal amplification phase.

An output voltage representing the content of the memory cell is provided at block 910. The output voltage is generated using the data current and the first and second reference currents. Suitable ways and arrangements for generating the output voltage are provided above.

It is appreciated that variations in the method 900 are contemplated. The order of the occurrence can vary from the order presented. Further, additional actions or blocks can be performed instead of or in addition to those described. Further, one or more of the blocks can be omitted.

Figure 10:
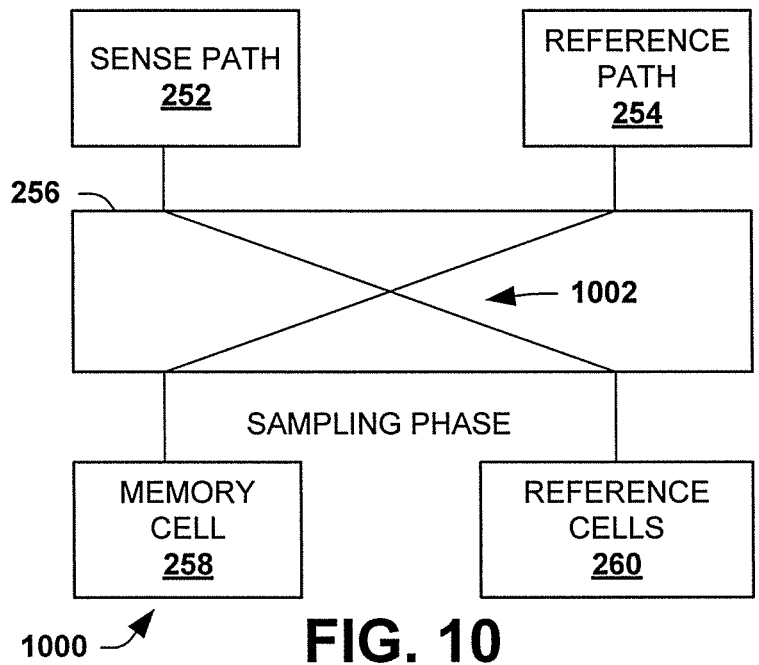
FIG. 10 is a block diagram depicting a sense amplifier system where a sense path is connected to a reference cell during a sampling phase.

FIG. 10 is a block diagram depicting a sense amplifier system 1000 where a sense path is connected to a reference cell during a sampling phase. This example is similar to the example systems provided above. The switch component 256 connects the sense path 252 to the reference cells 260, a first cell of the reference cells 260, during the sampling phase as indicated by 1002. Additionally, during the sampling phase the switch component 256 connects the reference path 254 to the memory cell 258 as indicated by 1002. Although not shown, the sense path 252 is connected to the memory cell component 258 and the reference path 254 is connected to the reference cells 260, a second cell of the reference cells 260, during the signal amplification phase. The first cell and the second cell are high and low resistivity reference cells.

Figure 11:
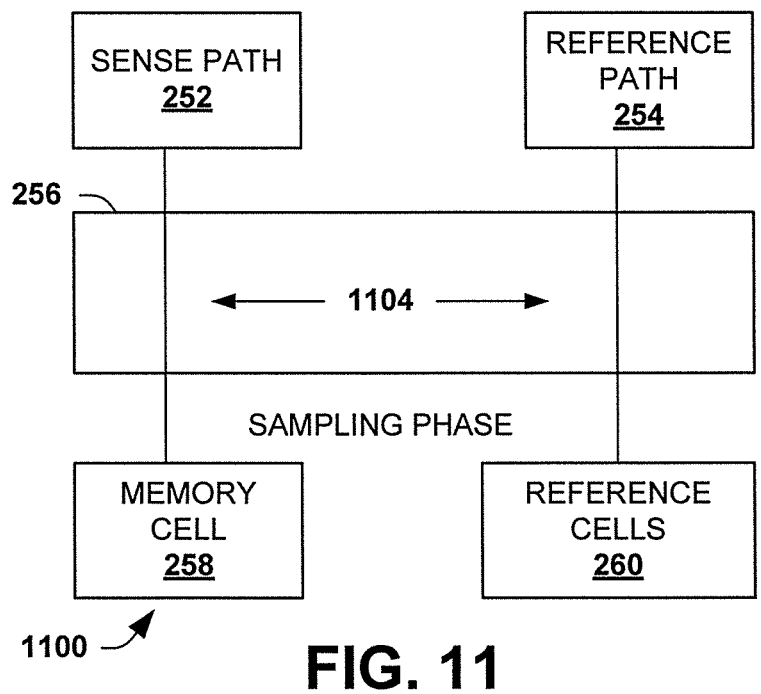
FIG. 11 is a block diagram depicting a sense amplifier system where a sense path is connected to a memory cell during a sampling phase.

FIG. 11 is a block diagram depicting a sense amplifier system 1100 where a sense path is connected to a memory cell during a sampling phase. FIG. 11 illustrates that the connections between the sense and reference paths 252 and 254 with the memory cell component 258 and the reference cells 260 can vary. In this example, the switch component 256 connects the sense path 252 to the memory cell 258 instead of the reference cells 260 during the sampling phase as indicated by 1104. Additionally, during the sampling phase, the switch component 256 connects the reference path 254 to the reference cells 260 instead of the memory cell 258 as indicated by 1104.

Figure 12:
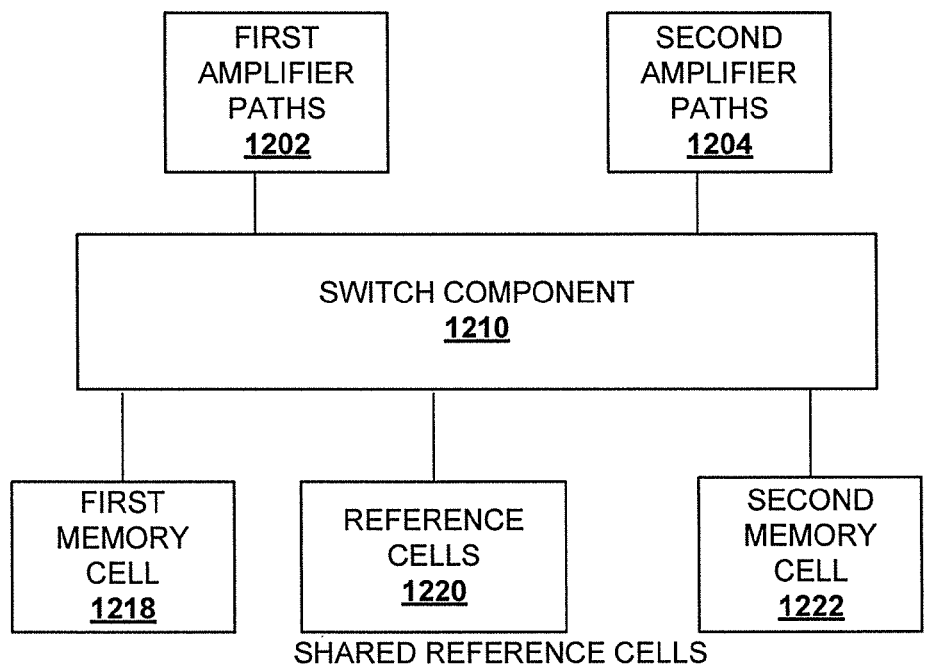
FIG. 12 is a block diagram illustrating a sense amplifier system configured to share reference cells.

FIG. 12 is a block diagram illustrating a sense amplifier system 1200 configured to share reference cells. The system 1200 includes a first sense amplifier comprised primarily of first amplifier paths 1202 and a first memory cell 1218 and a second sense amplifier comprised primarily of second amplifier paths 1204 and a second memory cell 1222. The amplifiers share reference cells 1220 by utilizing a switch component 1210. The switch component 1210 is configured to connect one of the reference cells 1220 to the first amplifier paths 1202 and an other of the reference cells 1220 to the second amplifier paths during phases such that both reference cells are being used simultaneously. As a result, using a separate reference cell for each sense amplifier is not required while similar performance can be obtained. Further, a single switch component 1210 can be utilized for both sense amplifiers further reducing the overall complexity.

Figure 13:
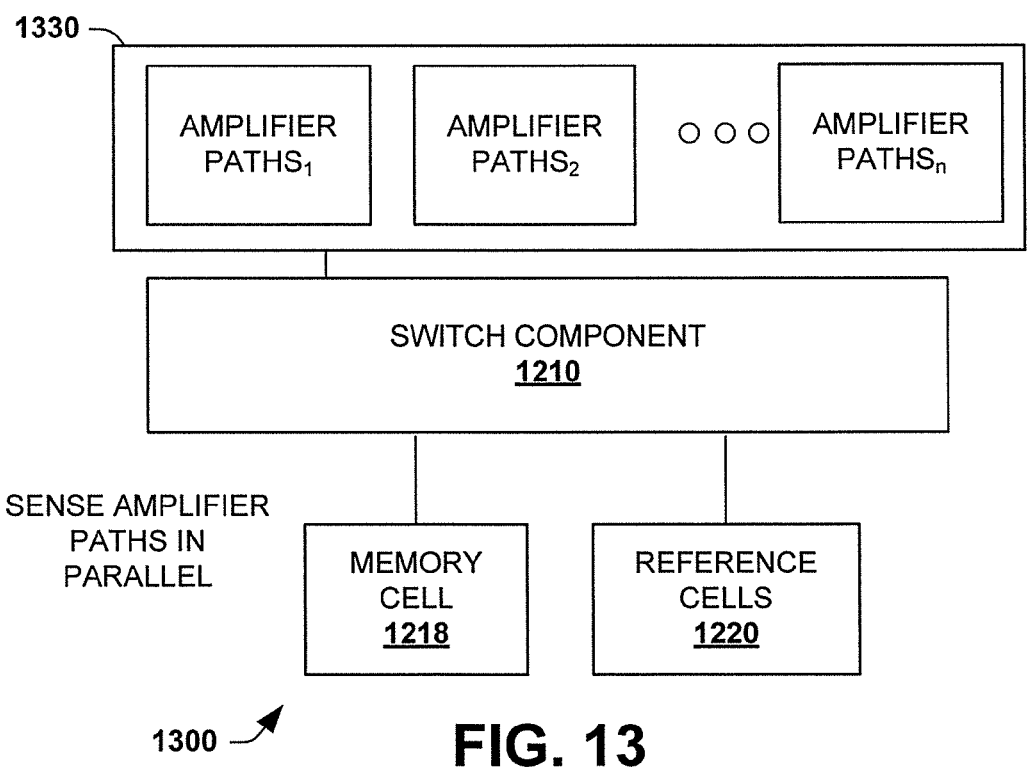
FIG. 13 is a block diagram illustrating a sense amplifier system having a plurality of amplifier paths in parallel.

FIG. 13 is a block diagram illustrating a sense amplifier system 1300 having a plurality of amplifier paths in parallel. The system 1300 includes a single switch component 1210, a memory cell 1218 and reference cells 1220, which operate as described above. The system 1300 also includes a plurality of amplifier paths 1330, where each amplifier path includes sense and reference paths.

The amplifier paths 1330 are connected in parallel. The parallel connections provide an enhanced equivalent signal. For example, if there are "n" amplifier paths connected in parallel, the total equivalent signal is "n+1" and there is only a relatively minor increase in signal offset. In one example, output nodes, such as nodes 228 and 230, and path connections, such as sources of transistors 206 and 208, are connected in parallel.

The switch component 1210 operates substantially similar to switch components described above and merely connects to a node that is connected to the paths connected in parallel.

Figure 14:
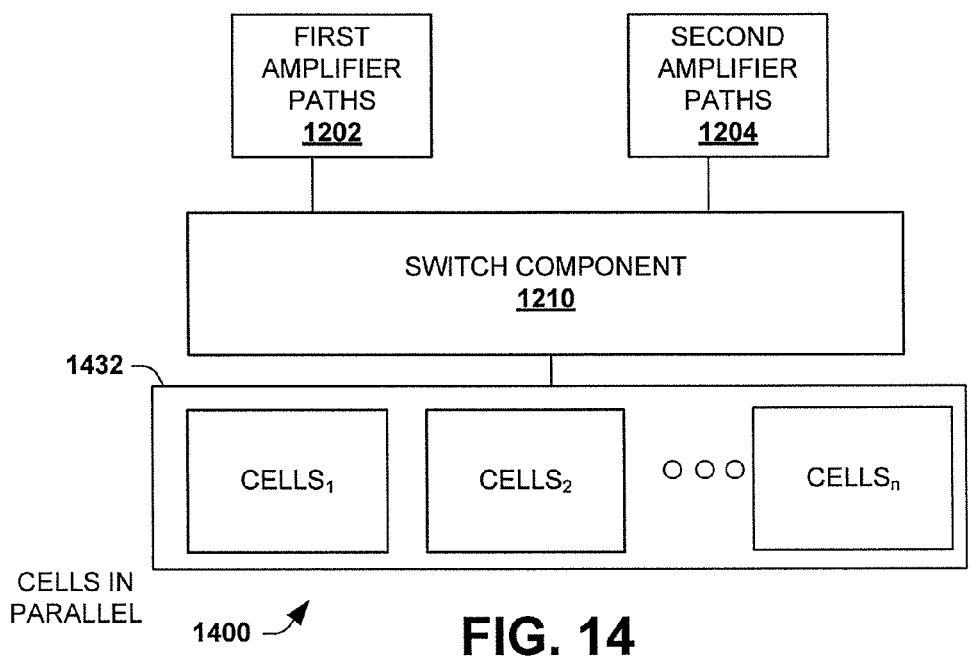
FIG. 14 is a block diagram illustrating a sense amplifier system having a plurality of sense amplifier cells connected in parallel.

FIG. 14 is a block diagram illustrating a sense amplifier system 1400 having a plurality of sense amplifier cells connected in parallel. The sense amplifier cells 1432 each include a memory cell, a high resistivity reference cell, and a low resistivity reference cell.

The sense amplifier cells 1432 are connected to the switch component 1210, which operates as if a standard set of amplifier cells is connected. By connecting the cells in parallel, variations in the low resistivity and the high resistivity reference currents can be mitigated. For example, the low resistivity reference cells are connected in parallel. The high resistivity reference cells are connected in parallel. In one example, the memory cells are accessed separately, but utilize parallel connections of the reference cells.

While the methods provided herein are illustrated and described as a series of acts or events, the present disclosure is not limited by the illustrated ordering of such acts or events. For example, some acts may occur in different orders and/or concurrently with other acts or events apart from those illustrated and/or described herein. In addition, not all illustrated acts are required and the waveform shapes are merely illustrative and other waveforms may vary significantly from those illustrated. Further, one or more of the acts depicted herein may be carried out in one or more separate acts or phases.

Furthermore, the claimed subject matter may be implemented as a method, apparatus, or article of manufacture using standard programming and/or engineering techniques to produce software, firmware, hardware, or any combination thereof to control a computer to implement the disclosed subject matter (e.g., the systems shown above are non-limiting examples of circuits that may be used to implement method(s) and/or variations thereof). The term "article of manufacture" as used herein is intended to encompass a computer program accessible from any computer-readable device, carrier, or media. Those skilled in the art will recognize many modifications may be made to this configuration without departing from the scope or spirit of the claimed subject matter.

A sense amplifier system includes a first path, a second path, a memory cell, a first reference cell, a second reference cell, and a switch component. The switch component is configured to switch between the first and second paths and the memory cell and the first and second reference cells according to a sampling phase and a signal amplification phase.

Another sense amplifier system includes a sense path, a reference path, and a switch component. The sense path includes a first PMOS transistor coupled to a first NMOS data transistor. The reference path includes a second PMOS transistor coupled to a second NMOS transistor. The switch component is selectively coupled to the sense path and the reference path. The switch component is configured to connect a memory cell to the reference path during a first phase and to connect the memory cell to the sense path during a second phase.

A method of operating a sense amplifier is disclosed. A magneto resistive memory cell is provided. Low resistivity and high resistivity reference cells are also provided. A first reference current is generated using a first reference cell. The first reference cell is selected from a low resistivity reference cell and a high resistivity reference cell. A second reference current is generated using a second reference cell. The second reference cell is selected from a low resistivity reference cell and a high resistivity reference cell. The second reference cell is varied from the first reference cell. Data current is generated using the memory cell. An output voltage representing a content of the memory cell is provided. The output voltage is generated according to the data current, the first reference current and the second reference current.

Although the invention has been illustrated and described with respect to one or more implementations, alterations and/or modifications may be made to the illustrated examples without departing from the spirit and scope of the appended claims. Furthermore, in particular regard to the various functions performed by the above described components or structures (assemblies, devices, circuits, systems, etc.), the terms (including a reference to a "means") used to describe such components are intended to correspond, unless otherwise indicated, to any component or structure which performs the specified function of the described component (e.g., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the terms "including", "includes", "having", "has", "with", or variants thereof are used in either the detailed description and the claims, such terms are intended to be inclusive in a manner similar to the term "comprising".

What is claimed is:

1. A sense amplifier system comprising:
a switch component coupled to a sense path,
a reference path, wherein the sense path and the reference path are different paths;
a memory cell;
a first reference cell;
a second reference cell, wherein the second reference cell has a different resistivity than the first reference cell; and
wherein the switch component is configured to switch connections between the first and second reference cells, the memory cell, the sense path and the reference path according to a sampling phase and an amplification phase, wherein the sense path is connected to the first reference cell during the sampling phase and the reference path is connected to the second reference cell during the amplification phase.

2. The system of claim 1, wherein the switch component is configured to connect the reference path to the memory cell during the sampling phase.

3. The system of claim 2, wherein the switch component is configured to connect the sense path to the memory cell during the amplification phase.

4. The system of claim 2, wherein the switch component is a multiplexor.

5. The system of claim 1, wherein the sense path and the reference path include a cascode component.

6. The system of claim 5, further comprising bias capacitors coupled to the cascode component, wherein the bias capacitors are configured to set gate voltages of cascode transistors of the cascode component.

7. The system of claim 1, wherein the sense path includes an offset capacitor configured to sense an offset during the sampling phase.

8. The system of claim 1, further comprising a common mode feedback structure coupled to the sense path and the reference path, the common mode feedback structure configured to provide a common mode feedback mode of operation.

9. The system of claim 8, further comprising a latch structure coupled to the common mode feedback structure, the first path, and the second path, the latch structure configured to provide a latch mode of operation.

10. The system of claim 1, wherein the first reference cell is a high resistivity reference cell.

11. The system of claim 1, wherein the first reference cell is a low resistivity reference cell and the second reference cell is a high resistivity reference cell, wherein the first reference cell is configured to enable a low resistivity reference current and the second reference cell is configured to enable a high resistivity reference current.

12. The system of claim 1, wherein the sense path includes a first differential output node and the reference path includes a second differential output node, wherein the first and second differential output nodes provide an output voltage during the amplification phase representative of a logical content of the memory cell.

13. A sense amplifier system comprising:
a sense path including a first transistor coupled to a first data transistor;
a reference path including a second transistor coupled to a second data transistor;
a first reference cell and a second reference cell, wherein the first reference cell and the second reference cell are configured to generate reference currents having different values; and
a switch component coupled to the sense path and the reference path, the switch component configured to connect a memory cell to the reference path and the first reference cell to the sense path during a first phase and to connect the memory cell to the sense path and the second reference cell to the reference path during a second phase.

14. The system of claim 13, wherein the first phase is a sampling phase.

15. The system of claim 13, wherein the sense path is configured to have a first reference current and the reference path is configured to have a data current during the first phase.

16. The system of claim 15, wherein the sense path is configured to have the data current and the reference path is configured to have a second reference current during the second phase, wherein the second reference current is varied from the first reference current.

17. The system of claim 16, wherein the first reference current is a high resistivity reference current and the second reference current is a low resistivity reference current.

18. A method of operating a sense amplifier, the method comprising:
- generating a first reference current in a sampling phase;
- generating a second reference current in an amplification phase, wherein a value of the second reference current is different than a value of the first reference current;
- generating a data current;
- connecting a sense path to the first reference current in the sampling phase;
- connecting a reference path to the second reference current in the amplification phase; and
- generating an output voltage according to the data current, the first reference current, and the second reference current.

19. The method of claim 18, further comprising providing a memory cell, wherein the memory cell is utilized to generate the data current and the output voltage represents a content of the memory cell.

20. The method of claim 18, wherein generating the first reference current comprises using a low resistivity reference cell.

21. The method of claim 18, wherein generating the first reference current comprises connecting the sense path to a first reference cell.

22. The method of claim 20, wherein generating the second reference current comprises connecting the reference path to a second reference cell.

* * * * *